(12) United States Patent
Murakami

(10) Patent No.: US 11,943,955 B2
(45) Date of Patent: Mar. 26, 2024

(54) DISPLAY DEVICE AND METHOD FOR MANUFACTURING DISPLAY DEVICE

(71) Applicant: SHARP KABUSHIKI KAISHA, Sakai (JP)

(72) Inventor: Shinzoh Murakami, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 445 days.

(21) Appl. No.: 17/279,519

(22) PCT Filed: Sep. 27, 2018

(86) PCT No.: PCT/JP2018/035956
§ 371 (c)(1),
(2) Date: Mar. 24, 2021

(87) PCT Pub. No.: WO2020/065825
PCT Pub. Date: Apr. 2, 2020

(65) Prior Publication Data
US 2021/0399261 A1    Dec. 23, 2021

(51) Int. Cl.
*H10K 50/844* (2023.01)
*G09F 9/30* (2006.01)
*H10K 59/12* (2023.01)
*H10K 59/131* (2023.01)
*H10K 71/00* (2023.01)
*H10K 102/00* (2023.01)

(52) U.S. Cl.
CPC .......... *H10K 50/844* (2023.02); *G09F 9/301* (2013.01); *H10K 59/131* (2023.02); *H10K 71/00* (2023.02); *H10K 59/1201* (2023.02); *H10K 2102/311* (2023.02)

(58) Field of Classification Search
None
See application file for complete search history.

(56) References Cited

U.S. PATENT DOCUMENTS

| 2017/0294621 | A1  | 10/2017 | Higano et al. |
| 2018/0047802 | A1  | 2/2018  | Yoon et al. |
| 2018/0178493 | A1* | 6/2018  | Fujioka ................. B32B 27/283 |

FOREIGN PATENT DOCUMENTS

| JP | H11258621 A  | 9/1999  |
| JP | 2017187705 A | 10/2017 |
| JP | 2018105909 A | 7/2018  |

* cited by examiner

*Primary Examiner* — Evren Seven
(74) *Attorney, Agent, or Firm* — ScienBiziP, P.C.

(57) ABSTRACT

A display device includes: a fold portion; and connection wires electrically connecting a terminal to a wire in a display region. In the fold portion, an inorganic-insulating-film first slit provided to an inorganic insulating film and a film-layer first slit provided to a film layer extend in a direction to intersect with an edge of a frame region. The display device includes: either an inorganic-insulating-film second slit intersecting with the inorganic-insulating-film first slit; or a film-layer second slit intersecting with the film-layer first slit. Either the inorganic-insulating-film second slit or the film-layer second slit is provided between pluralities of the connection wires adjacent to each other.

15 Claims, 19 Drawing Sheets

(a)

(b)

(c)

(a)

(b)

DISPLAY DEVICE AND METHOD FOR MANUFACTURING DISPLAY DEVICE

TECHNICAL FIELD

The disclosure relates to a display device including a light-emitting element.

BACKGROUND ART

Patent Document 1, which is directed to a display device, describes a technique to fold back a part of a flexible substrate against the back face of the flexible substrate.

CITATION LIST

Patent Literature

[Patent Document 1] Japanese Unexamined Patent Application Publication No. 2017-187705

SUMMARY

Technical Problem

A problem of Patent Document 1 is that, when the substrate of the display device is further bent in a direction different from the direction in which the substrate has already been folded back, a metal layer positioned in the fold and including wiring is likely to be broken.

Solution to Problem

In order to solve the above problem, a display device according to the disclosure includes: a display region including a plurality of display elements, and a frame region surrounding the display region; a film layer and a TFT layer stacked on top of an other in a stated order, the TFT layer including at least one inorganic insulating film; and a terminal and a fold portion in the frame region, the fold portion being formed between the terminal and the display region. The display device includes: an inorganic-insulating-film first slit provided to the inorganic insulating film, and a film-layer first slit provided to the film layer, the inorganic-insulating-film first slit and the film-layer first slit overlapping at least the fold portion, and extending in a direction to intersect with an edge of the frame region; a first resin film included in the TFT layer and provided to fill the inorganic-insulating-film first slit; a plurality of connection wires provided above the inorganic insulating film and the first resin film to overlap, and to intersect with, the fold portion, the connection wires electrically connecting the terminal to a wire in the display region; and either an inorganic-insulating-film second slit overlapping the fold portion and intersecting with the inorganic-insulating-film first slit, or a film-layer second slit overlapping the fold portion and intersecting with the film-layer first slit, either the inorganic-insulating-film second slit or the film-layer second slit being provided between pluralities of the connection wires adjacent to each other.

In order to solve the above problem, the disclosure is directed to a method for manufacturing a display device. The display device includes: a display region including a plurality of display elements, and a frame region surrounding the display region; a film layer and a TFT layer stacked on top of an other in a stated order, the TFT layer including at least one inorganic insulating film; and a terminal and a fold portion in the frame region, the fold portion being formed between the terminal and the display region. The method includes forming the film layer, and forming the TFT layer. The forming of the TFT layer includes forming an inorganic-insulating-film first slit in the fold portion, and the forming of the film layer includes a film-layer first slit in the fold portion. The inorganic-insulating-film first slit is provided to the inorganic insulating film. The film-layer first slit is provided to the film layer. The inorganic-insulating-film first slit and the film-layer first slit extend in a direction to intersect with an edge of the frame region. The forming of the TFT layer further includes: forming a first resin film provided to fill the inorganic-insulating-film first slit; and forming a plurality of connection wires provided above the inorganic insulating film and the first resin film to overlap, and to intersect with, the fold portion, the connection wires electrically connecting the terminal to a wire in the display region. The forming of the TFT layer involves forming an inorganic-insulating-film second slit intersecting with the inorganic-insulating-film first slit in the fold portion, and the forming of the film layer involves forming a film-layer second slit intersecting with the film-layer first slit in the fold portion. Either the inorganic-insulating-film second slit or the film-layer second slit is provided between pluralities of the connection wires adjacent to each other.

Advantageous Effects of Disclosure

The disclosure can provide a display device readily bending in a direction different from a direction in which a fold portion is folded, while reducing the risk of breaking wiring in the fold portion.

DESCRIPTION OF EMBODIMENTS

First Embodiment

In the descriptions below, the term "same layer" means that constituent features are formed in the same process. The term "lower layer (or layer below)" means that a constituent feature is formed in a previous process before a comparative layer is formed. The term "upper layer (or layer above)" means that a constituent feature is formed in a successive process after a comparative layer is formed.

Figure 1:
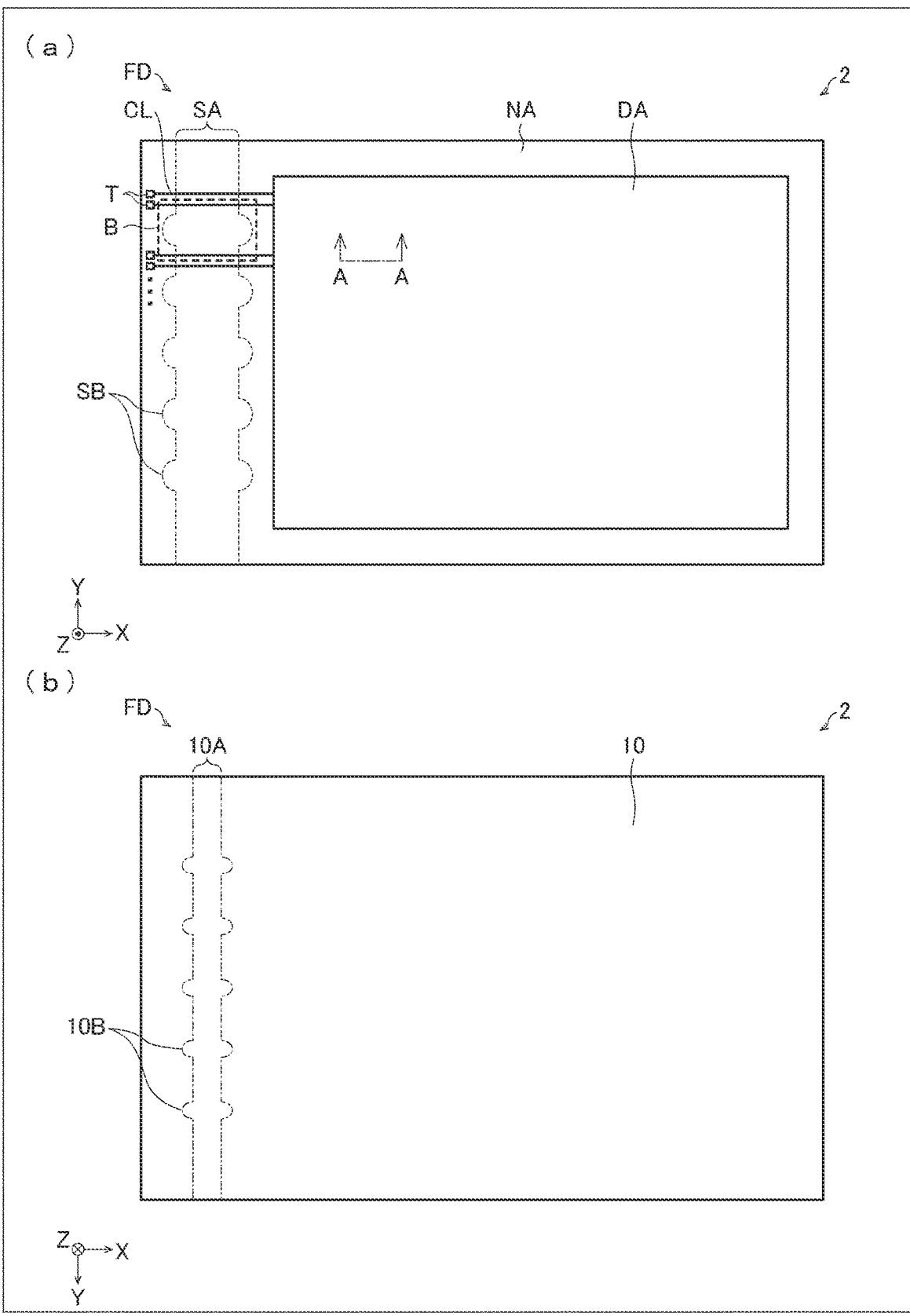
FIG. 1 illustrates a schematic top view and a schematic back view of a display device according to a first embodiment of the disclosure.
Figure 2:
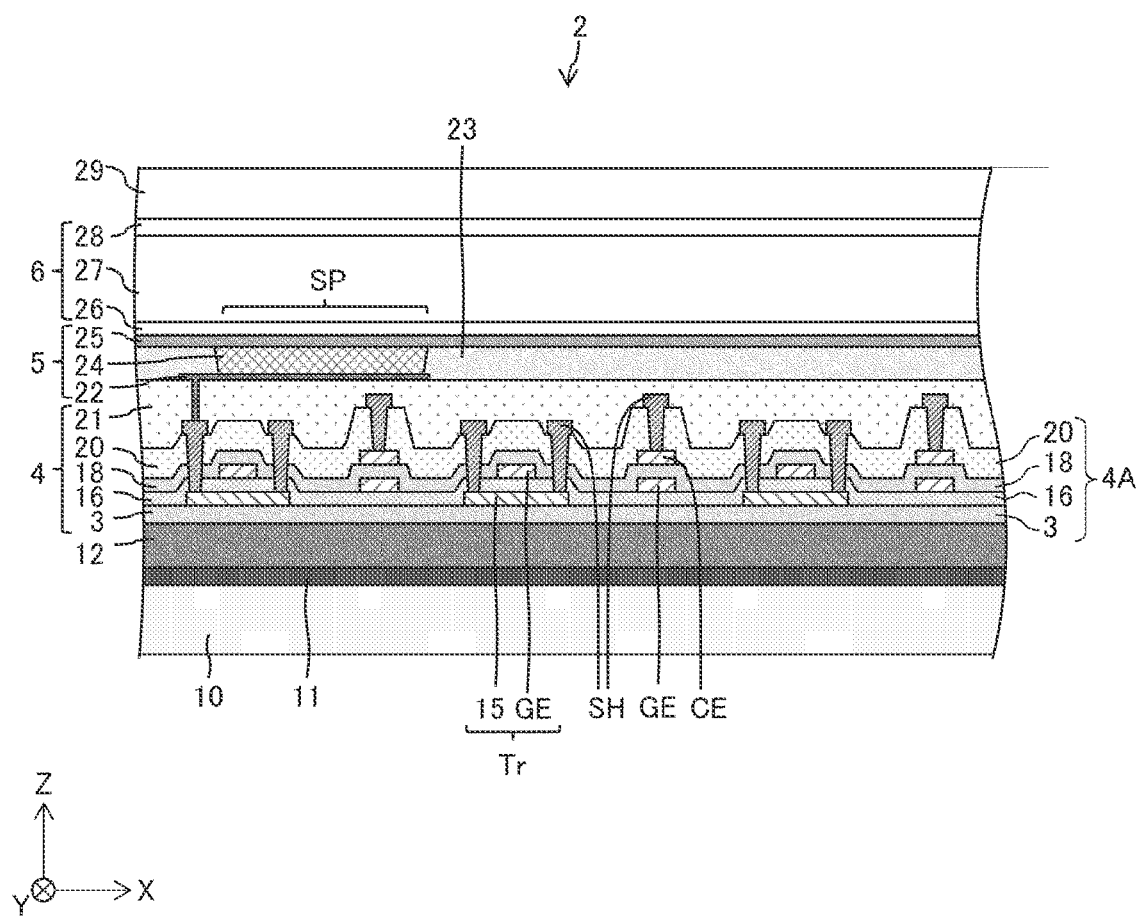
FIG. 2 illustrates a schematic cross-sectional view of a display region of the display device according to the first embodiment of the disclosure.
Figure 3:
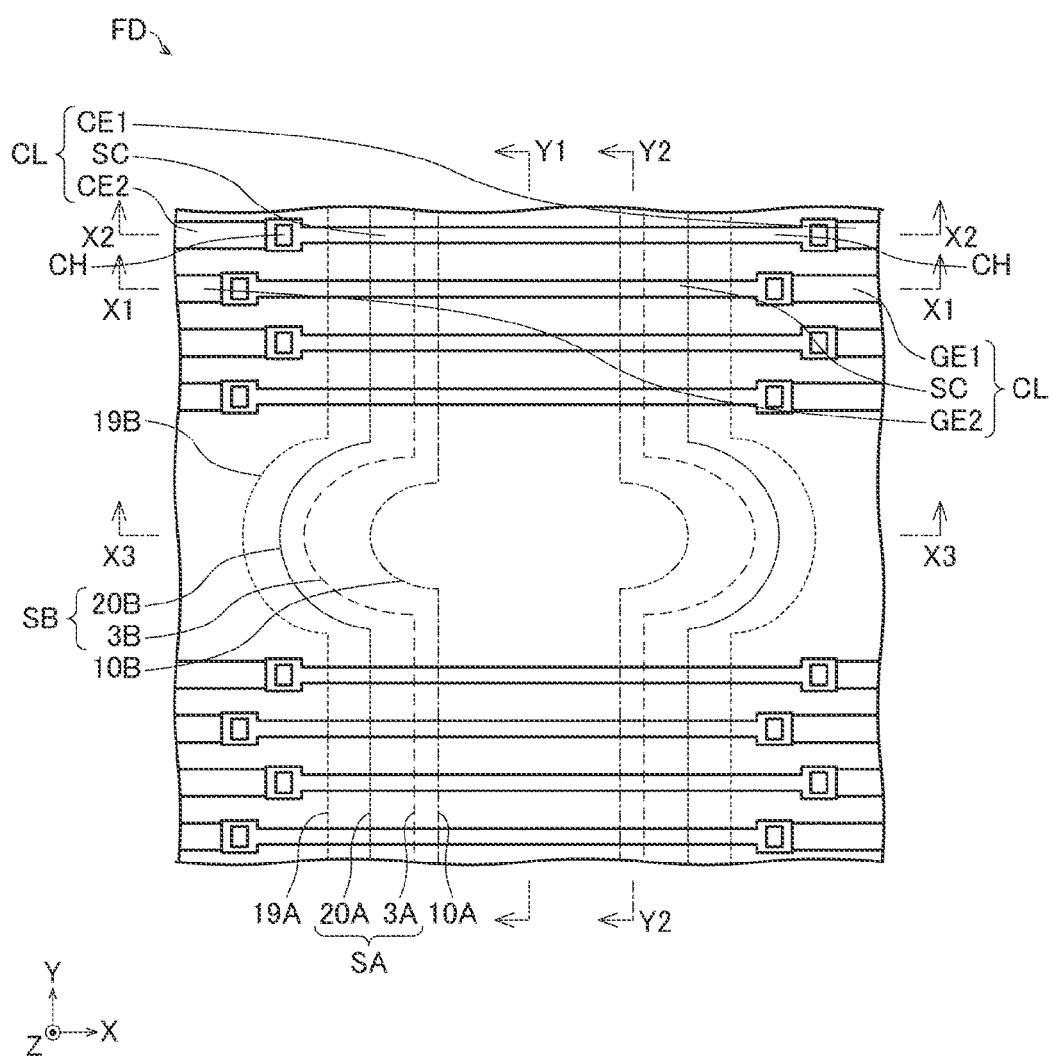
FIG. 3 illustrates an enlarged top view of a fold portion of the display device according to the first embodiment of the disclosure.

An illustration (a) of FIG. 1 is a top view of a display device 2 according to this embodiment. An illustration (b) of FIG. 1 is a back view of the display device 2 according to this embodiment. FIG. 2 illustrates a cross-sectional view taken along arrows A-A in the illustration (a) of FIG. 1. FIG. 3 illustrates an enlarged top view of a region B in the illustration (a) of FIG. 1; that is, a region including a third-inorganic-insulating-film second slit 20B to be described later. Note that the display device 2 in FIG. 1 is illustrated on a substantial plane and not folded along a fold portion FD to be described later.

Note that directions of the illustration (a) in FIG. 1 are defined as follows: A direction on the observer's right is a positive direction along an X-axis. An upward direction is a positive direction along a Y-axis. A direction toward the observer is a positive direction along a Z-axis. Moreover, X-axes, Y-axes, and Z-axes in the drawings of DESCRIPTION correspond to respective axes throughout the drawings. That is, as seen in the illustration (a) of FIG. 1, DESCRIPTION defines that the X-axis direction, the Y-axis direction, and the Z-axis direction respectively indicate a longitudinal direction of a display region DA of the display device 2, a transverse direction of the display region DA of the display device 2, and a thickness direction of the display device 2.

As seen in the illustration (a) of FIG. 1, the display device 2 according to this embodiment includes the display region DA and a frame region NA adjacent to, and surrounding, the display region DA. With reference to FIG. 2, described below in detail are configurations of the layers included in the display region DA of the display device 2 according to this embodiment.

As illustrated in FIG. 2, the display device 2 according to this embodiment includes: a film layer 10; a bonding layer 11; a resin layer 12; a TFT layer 4; a light-emitting element layer 5; a sealing layer 6; and a functional film 29 in the stated order from below. Note that the functional film 29 may have such functions as optical compensation, touch sensing, and protection.

The film layer 10 serving as a base-material film of the display device 2 may contain, for example, an organic resin material. The bonding layer 11, bonding the film layer 10 and the resin layer 12 together, may be formed of a conventionally known adhesive. The resin layer 12 is made of, for example, polyimide.

The TFT layer 4 includes: a barrier layer 3; a semiconductor film 15; a first inorganic insulating film 16 (a gate insulating film); a gate electrode GE; a second inorganic insulating film 18; a capacitance electrode CE; a third inorganic insulating film 20; a source wire SH (a metal wire layer); and a planarization film 21 (an interlayer insulating film) in the stated order from below. A TFT Tr is formed to include the semiconductor film 15, the first inorganic insulating film 16, and the gate electrode GE.

When the display device 2 is in use, the barrier layer 3 keeps water and impurities from reaching the TFT layer 4 and the light-emitting element layer 5. An example of the barrier layer 3 includes a silicon oxide film, a silicon nitride film, or a silicon oxide nitride film formed by the CVD, or a multilayer film including those films.

The semiconductor film 15 is formed of, for example, low-temperature polysilicon (LTPS) or an oxide semiconductor. Note that, in FIG. 2, the TFT including the semiconductor film 15 as a channel is of a top gate structure. Alternatively, the TFT may be of a bottom gate structure (when the channel of the TFT is, for example, an oxide semiconductor).

The gate electrode GE, the capacitance electrode CE, or the source wire SH may include at least one of such metals as aluminum (Al), tungsten (W), molybdenum (Mo), tantalum (Ta), chromium (Cr), titanium (Ti), and copper (Cu). That is, the gate electrode GE, the capacitance electrode CE, or the source wire SH is a monolayer film or a multilayer film made of these metals.

The first inorganic insulating film 16, the second inorganic insulating film 18, and the third inorganic insulating film 20 can be, for example, a silicon oxide (SiOx) film, or a silicon nitride (SiNx) film formed by the CVD, or a multilayer film including these films.

In this embodiment, the barrier layer 3, the first inorganic insulating film 16, the second inorganic insulating film 18, and the third inorganic insulating film 20 are included in an inorganic insulating film 4A.

The planarization film 21 may be made of an applicable photosensitive organic material such as polyimide and acrylic.

The light-emitting element layer 5 (e.g. an organic light-emitting diode layer) includes: a pixel electrode 22 (a first electrode, for example, an anode); a cover film (an edge cover) 23 covering an edge of the pixel electrode 22; a light-emitting layer 24; and an upper electrode (a second electrode, for example, a cathode) 25 in the stated order from below. For each of the sub-pixels SP, the light-emitting element layer 5 includes: a light-emitting element (e.g. an organic light-emitting diode or OLED) including the pixel electrode 22 shaped into an island, the light-emitting layer 24 shaped into an island, and the upper electrode 25; and a sub-pixel circuit driving the light-emitting element. Moreover, in the TFT layer 4, a transistor Tr is formed for each sub-pixel circuit, and the sub-pixel circuit is controlled through the control of the transistor Tr.

In plan view, the pixel electrode 22 is positioned to overlap the planarization film 21 and a contact hole that is an opening in the planarization film 21. The pixel electrode 22 is electrically connected through the contact hole to the source wire SH. Hence, the pixel electrode 22 is supplied with a signal of the TFT layer 4 through the source wire SH. Note that the pixel electrode 22 may have a thickness of, for example, 100 nm.

The pixel electrode 22 is shaped into an island for each of the sub-pixels SP. The pixel electrode 22 includes, for example, indium tin oxide (ITO) and an alloy containing Ag stacked on top of another, and reflects light. The upper electrode 25 is shaped into a monolithic form as a common layer for the sub-pixels. The upper electrode 25 can be formed of a light-transparent conductive material such as indium tin oxide (ITO) and indium zinc oxide (IZO).

The cover film 23, an organic insulating film, is formed in a position for covering the edge of the pixel electrode 22. The cover film 23 includes an opening 23c for each of the sub-pixels SP to partially expose the pixel electrode 22.

The light-emitting layer 24 includes, for example, a hole-transport layer, a light-emitting layer, and an electron-transport layer stacked on top of an other in the stated order from below. In this embodiment, at least one layer of the light-emitting layer 24 is formed by vapor deposition. Furthermore, in this embodiment, each of the layers of the light-emitting layer 24 may be shaped into an island for a corresponding one of the sub-pixels SP, or may be shaped into a monolithic form as a common layer for the sup-pixels SP.

If the light-emitting element layer 5 is an OLED layer, holes and electrons recombine together in the light-emitting layer 24 by a drive current between the pixel electrode 22 and the upper electrode 25, which forms an exciton. While the exciton transforms to the ground state, light is released. Since the upper electrode 25 is translucent and the pixel electrode 22 is light-reflective, the light emitted from the light-emitting layer 24 travels upward. This is how the display device 2 is of a top emission type.

The sealing layer 6 includes: a first inorganic sealing film 26 above the upper electrode 25; an organic sealing film 27 above the first inorganic sealing film 26; and a second inorganic sealing film 28 above the organic sealing film 27. The sealing layer 6 prevents such foreign objects as water and oxygen from penetrating into the light-emitting element layer 5. An example of the first and second inorganic sealing films 26 and 28 includes a silicon oxide film, a silicon nitride film, or a silicon oxide nitride film formed by the CVD, or a multilayer film including these films. The organic sealing film 27 may be made of an applicable photosensitive organic material such as polyimide and acrylic.

In this embodiment, the frame region NA includes the film layer 10 to the TFT layer 4 from among the layers in FIG. 2. The frame region NA further includes a terminal T and the fold portion FD.

The terminal T is formed at an end of the frame region NA. Mounted on the terminal T is a not-shown component such as a driver. The driver supplies a signal, through a connection wire CL from the display region DA, for driving each of the light-emitting elements in the display region DA. In this embodiment, the terminal T may be shaped into any given shape.

The fold portion FD is formed, between the terminal T and the display region, along a side of the frame region NA. The display device 2 bends along the fold portion FD so that a portion of the frame region NA can be folded back against a back face of the display device 2. The display device 2 is bent along the fold portion FD, and a portion of the frame region NA is folded back. Hence, the terminal T is disposed against the back face of the display device 2. Such a feature makes it possible to reduce an area of the frame region NA when the display device 2 is observed in a top view.

Figure 4:
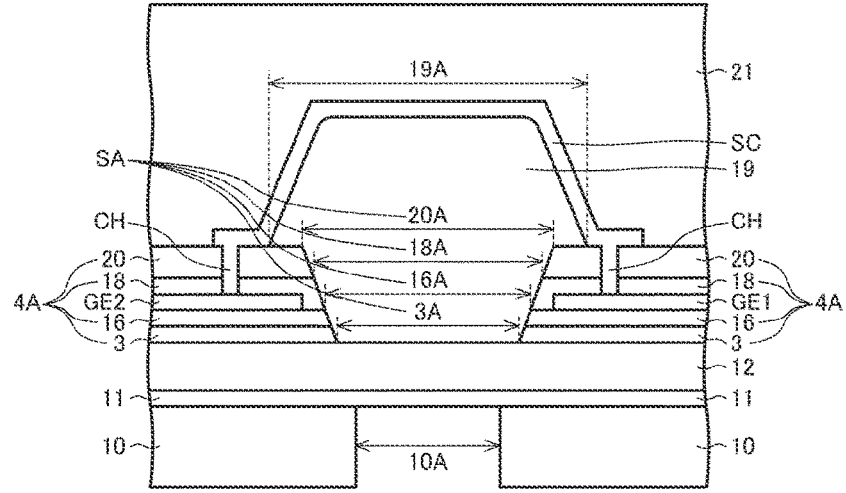
FIG. 4 illustrates a schematic cross-sectional view of the fold portion of the display device according to the first embodiment of the disclosure.
Figure 4:
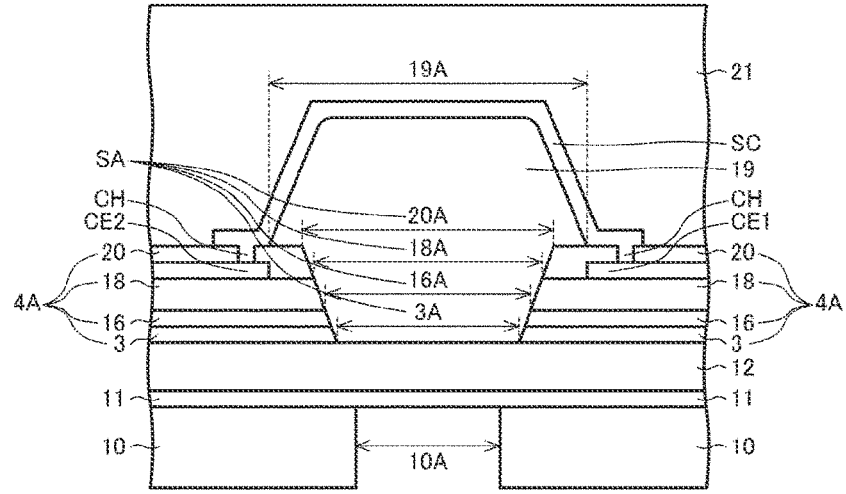
Figure 4:
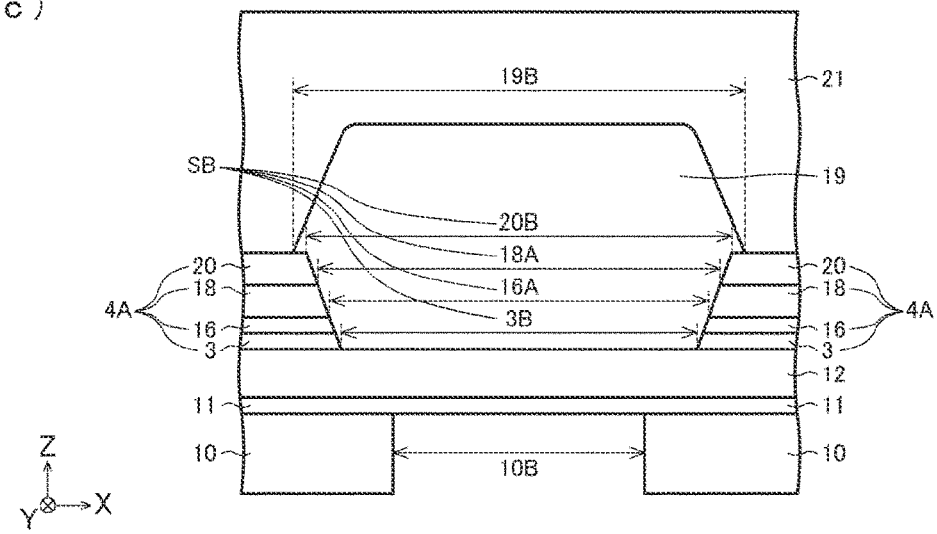
Figure 5:
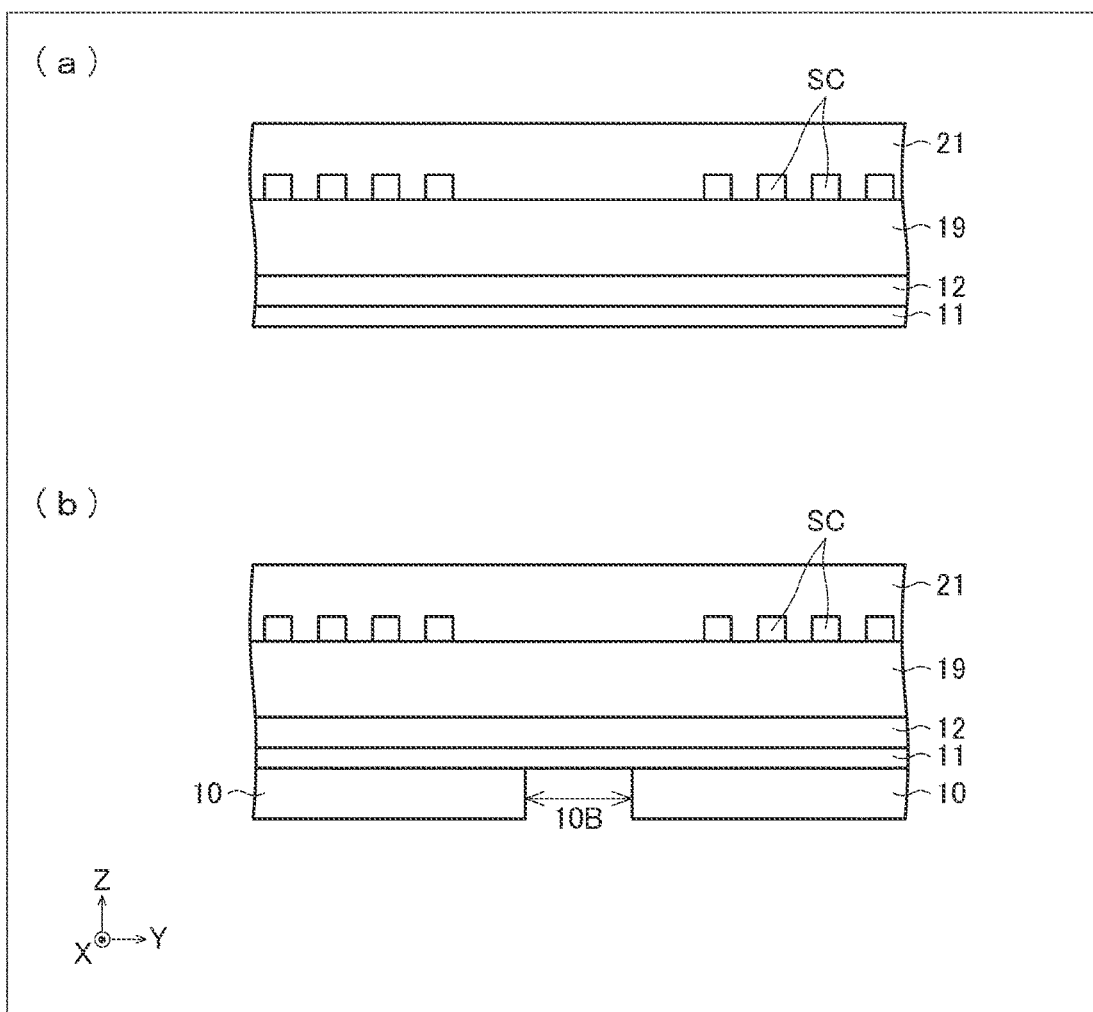
FIG. 5 illustrates an other schematic cross-sectional view of the fold portion of the display device according to the first embodiment of the disclosure.

Described in detail with reference to FIGS. 3 to 5 is a structure around the fold portion FD. FIG. 3 is an enlarged top view of the region B in the illustration (a) of FIG. 1. An illustration (a) of FIG. 4 is a cross-sectional view taken along arrows X1-X1 in FIG. 3. An illustration (b) of FIG. 4 is a cross-sectional view taken along arrows X2-X2 in FIG. 3. An illustration (c) of FIG. 4 is a cross-sectional view taken along arrows X3-X3 in FIG. 3. An illustration (a) of FIG. 5 is a cross-sectional view taken along arrows Y1-Y1 in FIG. 3. An illustration (b) of FIG. 5 is a cross-sectional view taken along arrows Y2-Y2 in FIG. 3.

As seen in FIG. 3 and the illustrations (a) and (b) of FIG. 4, the frame region NA includes a barrier-layer first slit 3A formed in a position to overlap the fold portion FD, and serving as a slit of the barrier layer 3.

The frame region NA further includes: a first-inorganic-insulating-film first slit 16A; a second-inorganic-insulating-film first slit 18A; and a third-inorganic-insulating-film first slit 20A formed in a position to overlap the fold portion FD and the barrier-layer first slit 3A, and each serving as a slit of a corresponding one of the first inorganic insulating film 16, the second inorganic insulating film 18, and the third inorganic insulating film 20. That is, the frame region NA includes an inorganic-insulating-film first slit SA formed in a position to overlap the fold portion FD, and serving as a slit of the inorganic insulating film 4A. FIG. 3 and the illustrations (a) and (b) in FIG. 4 show the barrier-layer first slit 3A and the third-inorganic-insulating-film first slit 20A respectively serve as a lower end slit and an upper end slit of the inorganic-insulating-film first slit SA. The inorganic-insulating-film first slit SA is formed to extend in a direction to intersect with an edge of the frame region NA. That is, the inorganic-insulating-film first slit SA is formed along the Y-axis across opposing ends of the frame region NA.

In addition, the frame region NA includes an inorganic-insulating-film second slit SB formed to partially overlap the fold portion FD, and branching from the inorganic-insulating-film first slit SA. FIG. 3 and the illustration (c) in FIG. 4 show a barrier-layer second slit 3B and a third-inorganic-insulating-film second slit 20B respectively serving as a lower end slit and an upper end slit of the inorganic-insulating-film second slit SB. The inorganic-insulating-film second slit SB is formed between pluralities of the connection wires CL adjacent to each other. Hence, the connection wires CL do not overlap the inorganic-insulating-film second slit SB.

In the frame region NA, the TFT layer 4 includes, as shown in the illustration (a) of FIG. 4, a first gate-electrode-layer frame wire GE1 led from the display region DA, and a second gate-electrode-layer frame wire GE2 led from the terminal T. The first gate-electrode-layer frame wire GE1 and the second gate-electrode-layer frame wire GE2 are formed in the same layer as the gate electrode GE, and are formed above the first inorganic insulating film 16. The first gate-electrode-layer frame wire GE1 and the second gate-electrode-layer frame wire GE2 may be formed together with the gate electrode GE.

Moreover, in the frame region NA, the TFT layer 4 in the illustration (b) of FIG. 4 includes: a first capacitance-electrode-layer frame wire CE1 led from the display region DA; and a second capacitance-electrode-layer frame wire CE2 led from the terminal T. The first capacitance-electrode-layer frame wire CE1 and the second capacitance-electrode-layer frame wire CE2 are formed in the same layer as the capacitance electrode CE, and are formed above the second inorganic insulating film 18. The first capacitance-electrode-layer frame wire CE1 and the second capacitance-electrode-layer frame wire CE2 may be formed together with the capacitance electrode CE.

Note that, in this embodiment, the first gate-electrode-layer frame wire GE1 and the first capacitance-electrode-layer frame wire CE1 are alternately formed. Furthermore, in this embodiment, the second gate-electrode layer frame wire GE2 and the second capacitance-electrode-layer frame wire CE2 are alternately formed. Hence, in the frame region NA, the neighboring wires are formed in different metal layers. Such a feature makes it possible to reduce short-circuit of the wires.

Moreover, in the frame region NA, the TFT layer 4 illustrated in FIG. 4 includes a fold-portion resin layer 19 serving as a first resin film provided to fill the inorganic-insulating-film first slit SA and the inorganic-insulating-film second slit SB. The fold-portion resin layer 19 may be made of the same material as that of the planarization film 21 or the resin layer 12, or may be made of an organic resin material that is different from the materials of the planarization film 21 and the resin layer 12. Furthermore, as illustrated in FIG. 4, the fold-portion resin layer 19 may be provided to fill the inorganic-insulating-film first slit SA and the inorganic-insulating-film second slit SB.

In addition, a source-wire-layer frame wire SC is formed above the fold-portion resin layer 19 and the third inorganic insulating film 20. The source-wire-layer frame wire SC may be formed in the same layer as the source wire SH is, and may be formed together with the source wire SH.

The source-wire-layer frame wire SC is electrically connected to the first gate-electrode-layer frame wire GE1 and the second gate-electrode-layer frame wire GE2. Moreover, the source-wire-layer frame wire SC is electrically connected to the first capacitance-electrode-layer frame wire CE1 and the second capacitance-electrode-layer frame wire CE2. As shown in FIG. 3 and the illustrations (a) and (b) in FIG. 4, the electric connection is established through a contact CH included in the source-wire-layer frame wire SC and formed inside a contact hole in each of the second inorganic insulating film 18 and the third inorganic insulating film 20.

The source-wire-layer frame wire SC, the first gate-electrode-layer frame wire GE1, and the second gate-electrode-layer frame wire GE2 constitute the connection wires CL electrically connecting the terminal T to a wire in the display region DA. Moreover, the source-wire-layer frame wire SC, the first capacitance-electrode-layer frame wire CE1, and the second capacitance-electrode-layer frame wire CE2 also constitute the connection wires CL. The planarization film 21 serving as a second resin film is formed above the fold-portion resin layer 19 and the source-wire-layer frame wire SC. The source-wire-layer frame wire SC is included in the connection wire CL and exposed from the fold-portion resin layer 19.

Furthermore, as shown in the illustration (b) of FIG. 1 and FIGS. 3 and 4, a film-layer first slit 10A is formed, to serve as a slit of the film layer 10, in a position to overlap the fold portion FD and the inorganic-insulating-film first slit SA. The film-layer first slit 10A is also formed to extend in a direction to intersect with an edge of the frame region NA. Hence, as can be clearly seen from the illustration (a) of FIG. 5, the film layer 10 is not formed in a position to overlap the fold portion FD.

Here, since the resin layer 12 is more flexible than the film layer 10, a portion of the frame region NA can be folded back along the fold portion FD against the back face of the display device 2. Note that if a bending width of the fold portion FD is as wide as, or narrower than, a width of the film-layer first slit 10A, the fold portion FD can bend.

Note that, in FIGS. 4 and 5, the bonding layer 11 is formed in a position including no film layer 10. However, forming the bonding layer may be determined in any given manner. The bonding layer 11 inside the film-layer first slit 10A may be either omitted or partially left.

Moreover, a film-layer second slit 10B branching from the film-layer first slit 10A is formed in a position to overlap the fold portion FD. The film-layer second slit 10B is formed between pluralities of the connection wires CL adjacent to each other. Hence, as clearly seen in the illustration (b) of FIG. 5, the connection wires CL do not overlap the film-layer second slit 10B. The bonding layer 11 inside the film-layer second slit 10B may also be either omitted or partially left.

As illustrated in FIG. 3, the barrier-layer second slit 3B is formed to lie out of opposing ends, of the barrier-layer first slit 3A, each toward one of the display region DA and the terminal T. Likewise, the third-inorganic-insulating-film second slit 20B is formed to lie out of opposing ends, of the third-inorganic-insulating-film first slit 20A, each toward one of the display region DA and the terminal T. In a still similar manner, the film-layer second slit 10B is formed to lie out of opposing ends, of the film-layer first slit 10A, each toward one of the display region DA and the terminal T.

Note that, as illustrated in FIG. 3, the fold-portion resin layer 19 includes: an end 19A formed to lie out of the inorganic-insulating-film first slit SA; and an end 19B formed to lie out of the inorganic-insulating-film second slit SB. In a still similar manner, the end 19B is formed to lie out of the end 19A toward both the display region DA and the terminal T.

Hence, the inorganic-insulating-film second slit SB lies closer to the display region and the terminal than the inorganic-insulating-film first slit SA lies. In a similar manner, the film-layer second slit 10B lies closer to the display region and the terminal than the inorganic-insulating-film first slit SA and the film-layer first slit 10A lie.

Here, as shown in the illustrations (a) and (b) of FIG. 4, the end 19A is formed to lie out of the third-inorganic-insulating-film first slit 20A. Moreover, the third-inorganic-insulating-film first slit 20A is wider than the barrier-layer first slit 3A. Furthermore, the barrier-layer first slit 3A is wider than the film-layer first slit 10A. Hence, the inorganic-insulating-film first slit SA and the fold-portion resin layer 19 above the inorganic-insulating-film first slit SA are wider than the film-layer first slit 10A.

In a similar manner, as shown in the illustration (c) of FIG. 4, the end 19B is formed to lie out of the third-inorganic-insulating-film second slit 20B. Moreover, the third-inorganic-insulating-film second slit 20B is wider than the barrier-layer second slit 3B. Furthermore, the barrier-layer second slit 3B is wider than the film-layer second slit 10B. Hence, the inorganic-insulating-film second slit SB and the fold-portion resin layer 19 above the inorganic-insulating-film second slit SB are wider than the film-layer second slit 10B.

Figure 6:
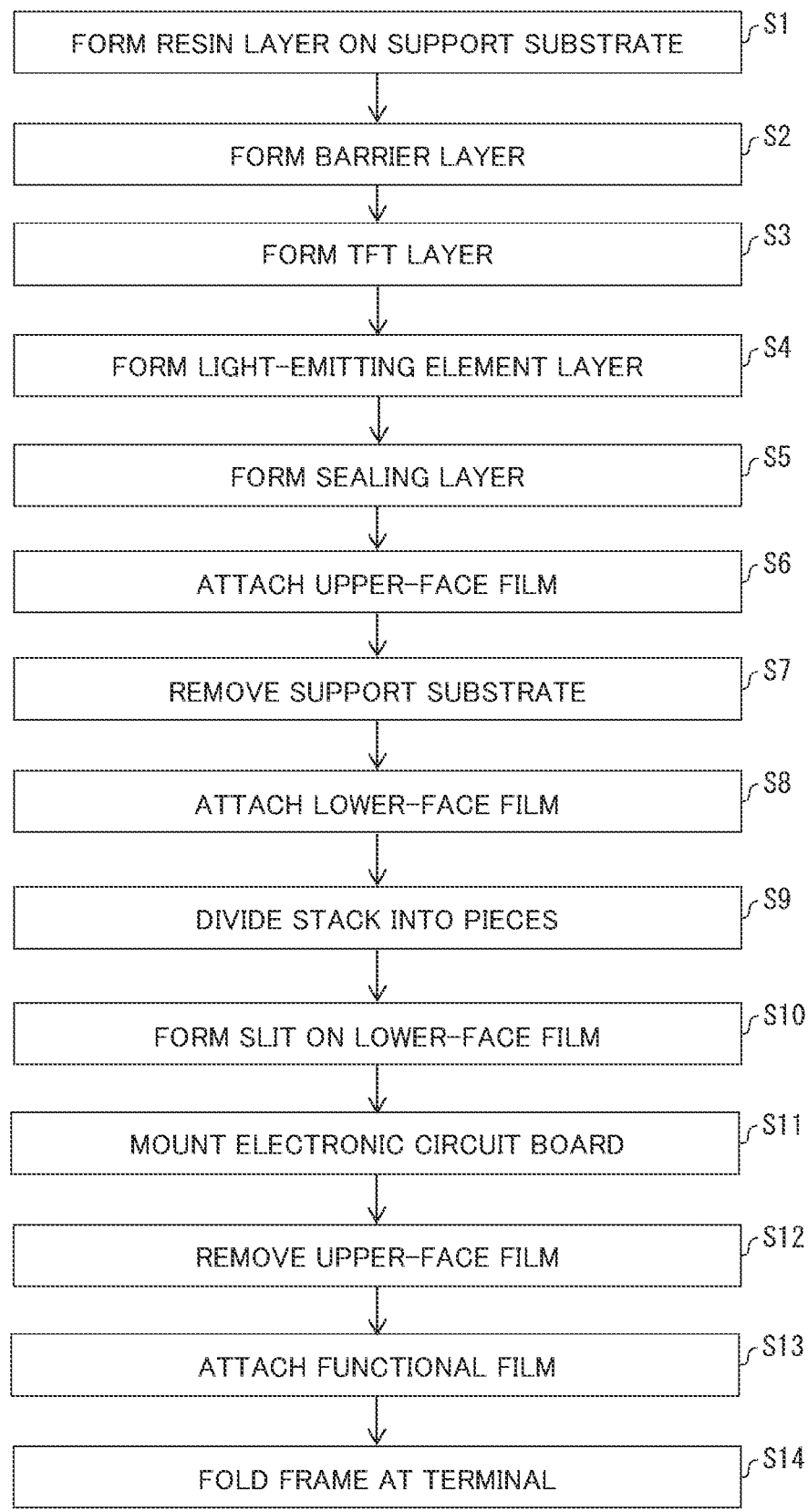
FIG. 6 illustrates a flowchart showing a method for manufacturing the display device according to the first embodiment of the disclosure.

A method for manufacturing a display device according to this embodiment is described in detail with reference to flowchart in FIG. 6.

First, at Step S1, the resin layer 12 is formed on a transparent support substrate (e.g. a mother glass). At Step S2, the barrier layer 3 is formed above the resin layer 12. At Step S2, the barrier-layer first slit 3A and the barrier-layer second slit 3B may be formed; whereas, the barrier layer 3 may be deposited but does not have to be patterned.

Figure 7:
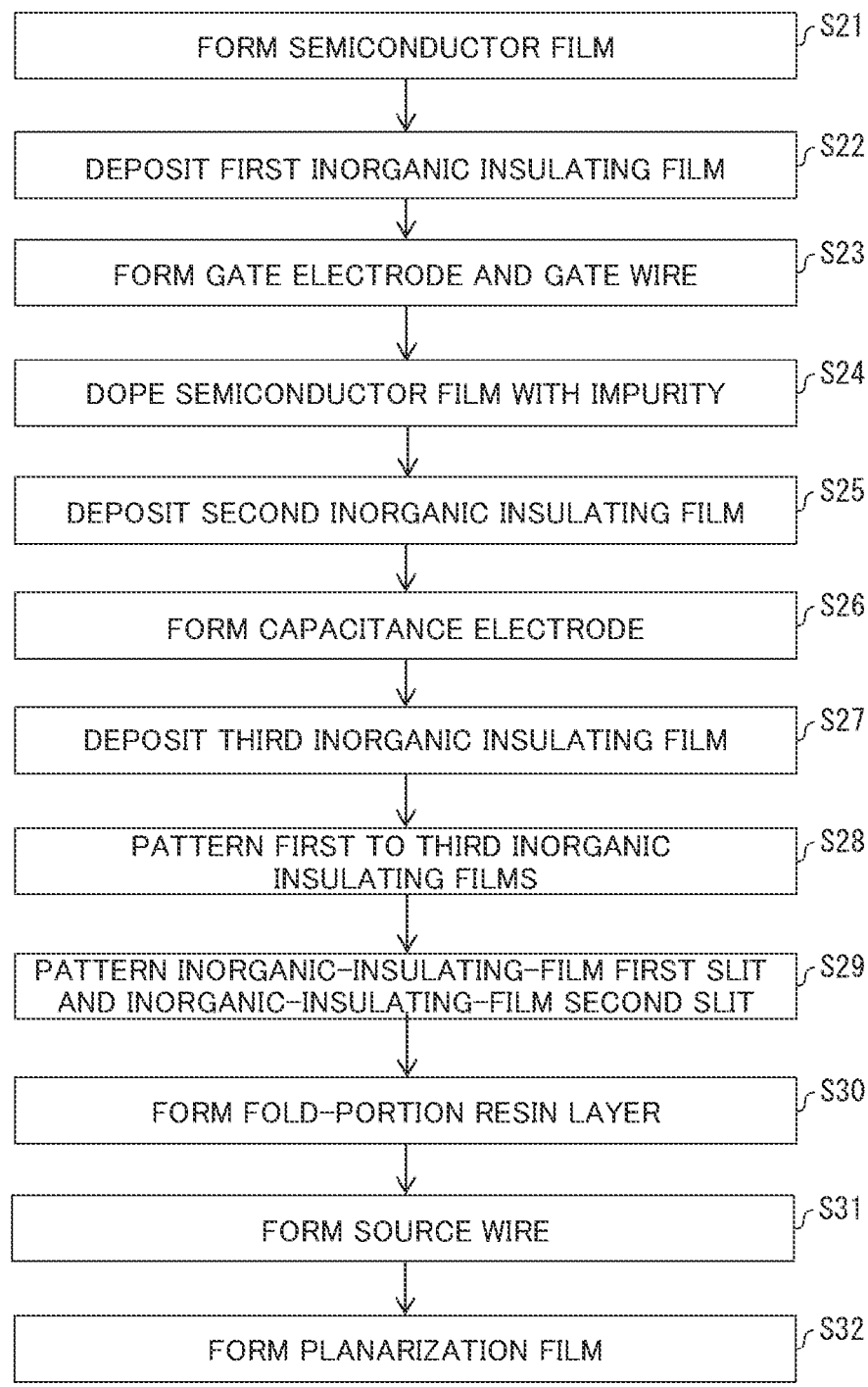
FIG. 7 illustrates a flowchart showing an example of a method for manufacturing a thin-film transistor (TFT) layer of the display device according to the first embodiment of the disclosure.

At Step S3, the layers of the TFT layer 4 except the barrier layer 3 are formed above the barrier layer 3. Step S3 is described more specifically, with reference to a flowchart in FIG. 7. Note that the term "depositing" hereinafter means deposition of a thin film of a corresponding member, but not subsequent patterning of the thin film. Moreover, the term "forming" means a treatment to include deposition of a thin film of a corresponding member, followed by patterning the thin film.

First, at Step S21, the semiconductor film 15 is formed. At Step 22, the first inorganic insulating film 16 is deposited. At Step S23, the gate electrode GE and a gate wire connected to the gate electrode GE are formed. Here, at Step S23, the first gate-electrode-layer frame wire GE1 and the second gate-electrode-layer frame wire GE2 are also formed together.

At Step S24, the semiconductor film 15 is doped with an impurity. Step S24 can be carried out by a technique to dope a channel of a conventional TFT with various kinds of impurities. At Step 25, the second inorganic insulating film 18 is deposited. At Step S26, the capacitance electrode CE is formed. At Step S26, the first capacitance-electrode-layer frame wire CE1 and the second capacitance-electrode-layer frame wire CE2 may also be formed together. At Step 27, the third inorganic insulating film 20 is deposited.

At Step 28, deposited films; namely, the first inorganic insulating film 16, the second inorganic insulating film 18, and the third inorganic insulating film 20, are patterned by, for example, photolithography. Here, at Step 28, the contact hole in which the contact CH of the source-wire-layer frame wire SC is formed is also formed in the second inorganic insulating film 18 and the third inorganic insulating film 20.

At Step S29, the inorganic-insulating-film first slit SA and the inorganic-insulating-film second slit SB are formed. Step S29 involves patterning the inorganic-insulating-film first slit SA and the inorganic-insulating-film second slit SB by photolithography.

Furthermore, if the barrier layer 3 is only deposited but not patterned at Step S2, the barrier layer 3 may be patterned at Step S29. That is, at Step S29, the barrier-layer first slit 3A and the barrier-layer second slit 3B may be formed.

At Step S29, the inorganic insulating film 4A is etched all at once up to the resin layer 12 such that the slits included in the inorganic-insulating-film first slit SA are formed to overlap one an other. Moreover, at Step S29, the inorganic insulating film 4A is etched all at once up to the resin layer 12 such that the slits included in the inorganic-insulating-film second slit SB are also formed to overlap one another. In this description, Step S28 and Step S29 are carried out separately. Alternatively, Step S28 and Step S29 may be carried out simultaneously.

At Step S30, the fold-portion resin layer 19 is formed to fill the inorganic-insulating-film first slit SA and the inorganic-insulating-film second slit SB. At Step S31, the source wire SH is formed. Here, at Step S31, the source-wire-layer frame wire SC and the contact CH are also formed together. At Step S32, the planarization film 21 is formed, and the formation of the TFT layer 4 is completed.

Here, in forming members in Steps S21, S23, S26, and S28 to S32, the members may be deposited first, and, after that, processed by photolithography.

Next, at Step S4, the light-emitting device layer (e.g. an OLED element layer) 5 of a top emission type is formed. At Step S4, the layers of the light-emitting element layer 5 may be formed by a conventionally known technique. In particular, the light-emitting layer 24 may be formed by, for example, vapor deposition.

At Step S5, the sealing layer 6 is formed. At Step S6, an upper-face film is attached. At Step S7, the support substrate is removed from the stack. An example technique for removing the support substrate may involve emitting a laser beam to a lower face of the resin layer 12 through the support substrate to reduce bonding strength between the support substrate and the resin layer 12, and removing the support substrate from the resin layer 12. At Step S8, the film layer 10 serving as a lower-face film is attached to the resin layer 12 through the bonding layer 11. At Step S8, the film-layer first slit 10A and the film-layer second slit 10B may also be formed.

At Step S9, the stack from the film layer 10 to the upper-face film is separated into a plurality of pieces, using for example, a laser beam. At Step S10, a laser beam is emitted on the film layer 10 of each of the pieces to partially remove the film layer 10, so that the film-layer first slit 10A and the film-layer second slit 10B are formed.

In this embodiment, the film layer 10 is partially removed by the emission of the laser beam. Alternately, the film layer 10 may be removed by any given technique. At Step S8, for example, the lower-face film to be attached may be provided with notches, using a die. The notches may be conformable with the shapes of the film-layer first slit 10A and the film-layer second slit 10B. In such a case, the portions of the notches are removed at Step S10 so that the film-layer first slit 10A and the film-layer second slit 10B can be formed.

At Step S11, an electronic circuit board (e.g. an IC chip, an FPC, or a chip on film (COF)) is mounted on the terminal T. At Step S12, the upper-face film is removed from each of the pieces. At Step S13, the functional film 29 is attached to an upper face of each piece.

Finally, at Step S14, the display device 2 is folded at an end, of the fold portion FD, toward the display region DA. This is how a portion, of the frame region NA, including the terminal T is folded back against the back face of the display device 2. Hence, the terminal T is positioned against the back face of the display device 2. After the electronic circuit board is mounted on the terminal T, the portion, of the frame region, including the terminal T is folded back against the back face of the display device 2. Such a feature makes it possible to reduce an area of the frame region NA in planner view, and to provide the display device 2 with a narrow frame region.

Figure 8:
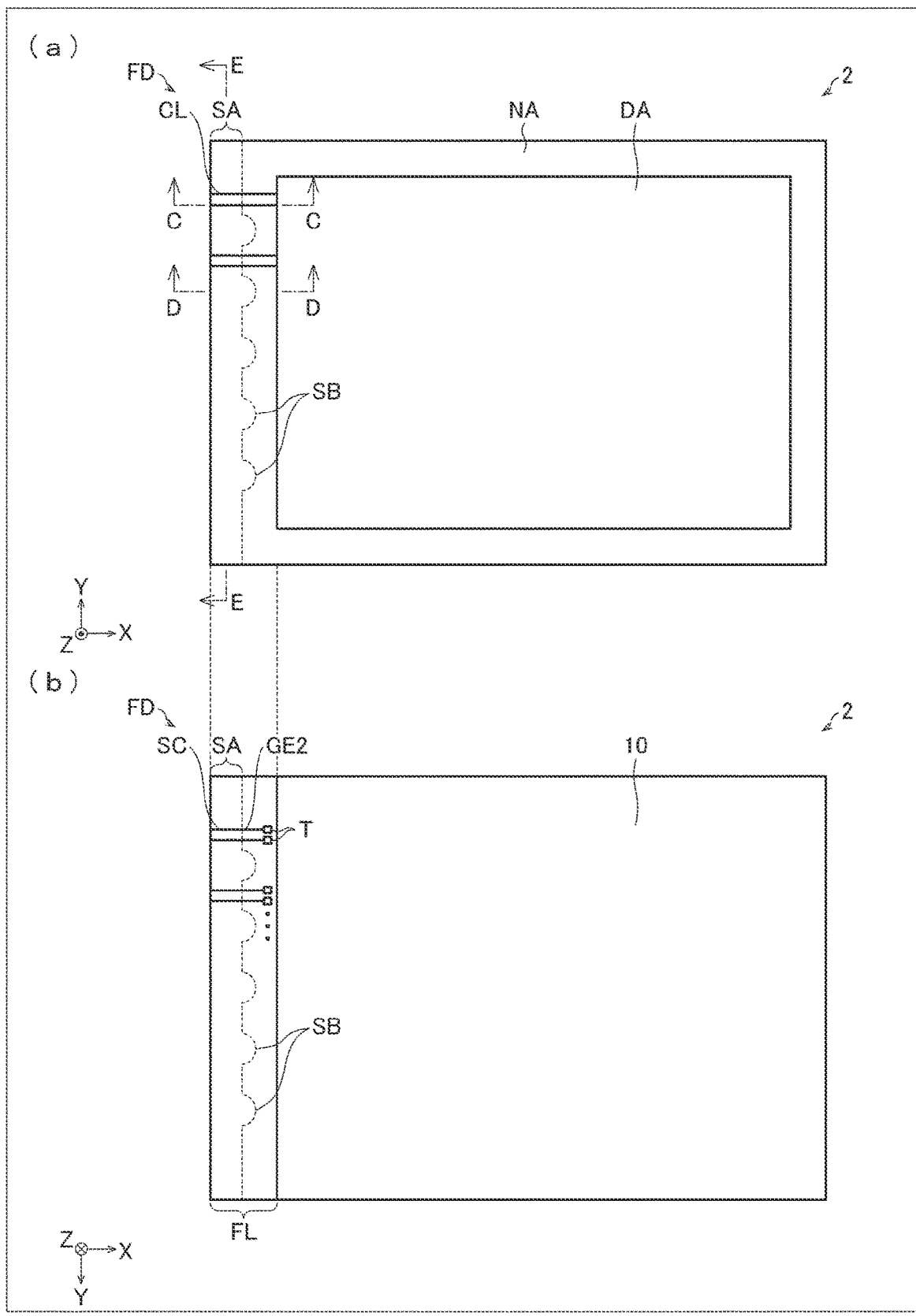
FIG. 8 illustrates a schematic top view and a schematic back view of the display device having the fold portion folded according to the first embodiment of the disclosure.

An illustration (a) in FIG. 8 is a schematic top view of the display device 2. In the illustration (a), a portion, of the frame region NA, including the terminal T is folded back against the back face of the display device 2. An illustration (b) of FIG. 8 is a schematic back view of the display device 2 in the illustration (a) of FIG. 8. As illustrated in FIG. 8, the display device 2 is folded along the fold portion FD. Hence, a fold-back region FL, which is the portion, of the frame region NA, including the terminal T, is folded back against the back face of the display device 2.

Figure 9:
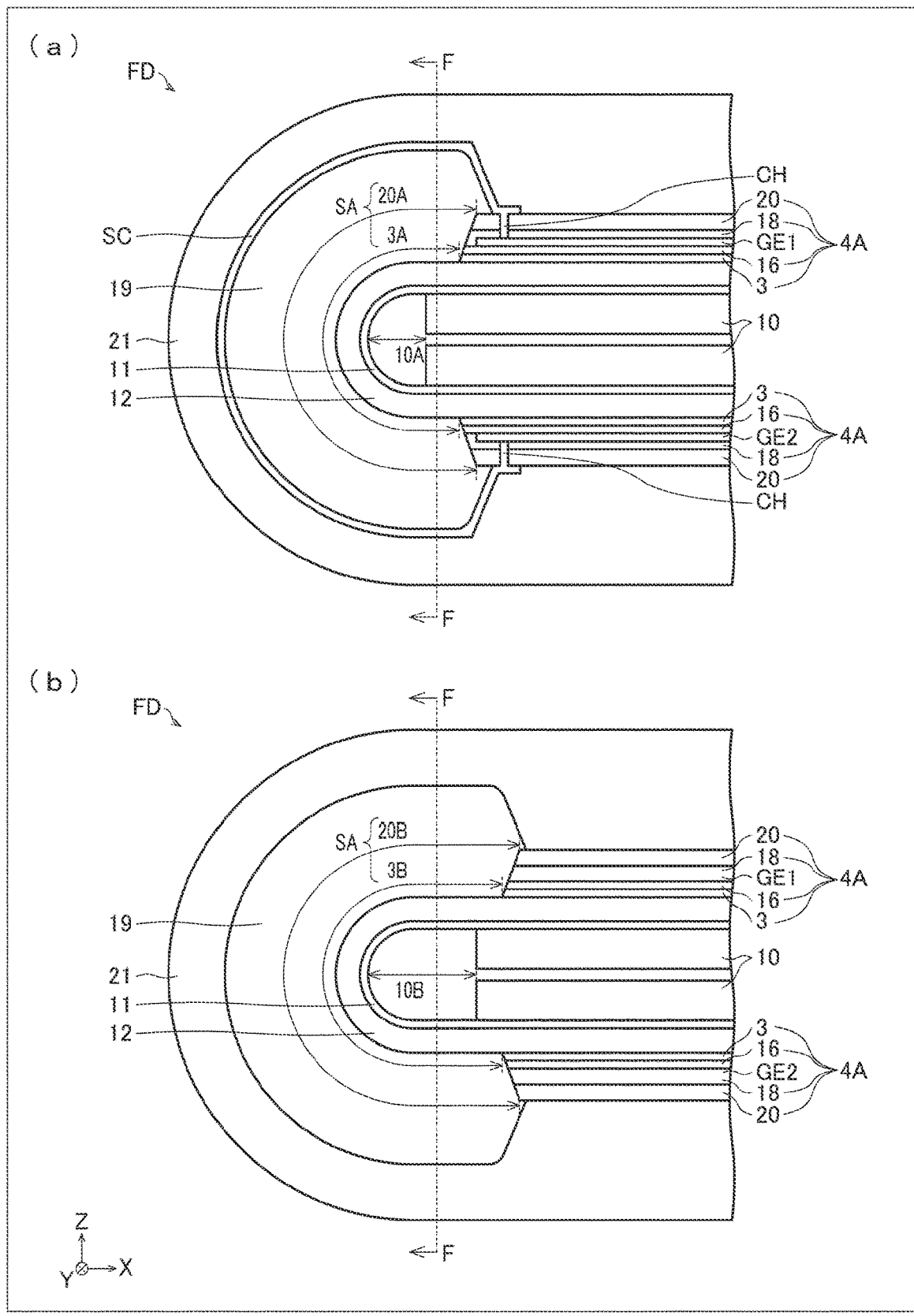
FIG. 9 illustrates a schematic cross-sectional view of the folded fold portion of the display device according to the first embodiment of the disclosure.
Figure 10:
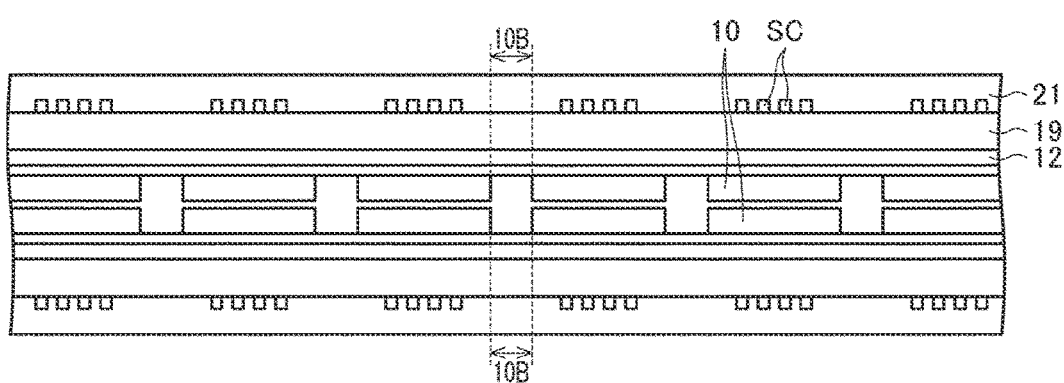
FIG. 10 illustrates an other schematic cross-sectional view of the folded fold portion of the display device according to the first embodiment of the disclosure.
Figure 10:
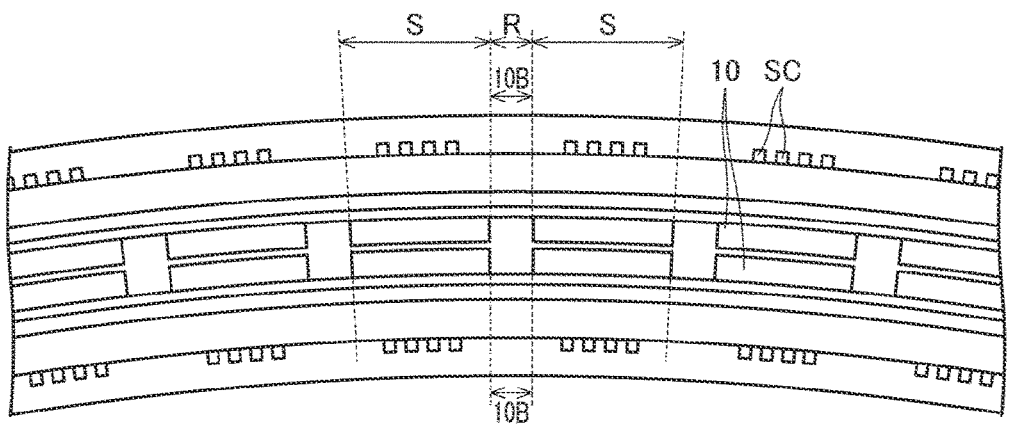

A structure around the fold-back region FL of the display device 2 is described below, with reference to FIGS. 9 and 10. An illustration (a) of FIG. 9 is a cross-sectional view taken along arrows C-C in the illustration (a) of FIG. 8. An illustration (b) of FIG. 9 is a cross-sectional view taken along arrows D-D in the illustration (a) of FIG. 8. Moreover, an illustration (a) of FIG. 10 is a cross-sectional view taken along arrows E-E in the illustration (a) of FIG. 8.

That is, the illustrations (a) and (b) of FIG. 9 are cross-sectional views of positions in which the connection wire CL and the third-inorganic-insulating-film second slit 20B overlap in the X-axis direction. Moreover, the illustration (a) of FIG. 10 is a cross-sectional view of a plane orthogonal to the X-axis. The plane does not overlap the film-layer first slit 10A, and intersects with the film-layer second slit 10B. The illustration (a) of FIG. 10 corresponds to a cross-sectional view taken along arrows F-F in an illustration (b) of FIG. 9.

As shown in the illustrations (a) and (b) in FIG. 9, the display device 2 bends along the fold portion FD in an R-shape in an enlarged view. The size of the R-shape may be determined, depending on a thickness of the film layer 10. Here, the film layer 10 in the position to overlap the fold portion FD is removed with the film-layer first slit 10A or the film-layer second slit 10B. Hence, even if the display device 2 is folded along the fold portion FD, the film layer 10 is free from great stress.

Furthermore, each of the barrier layer 3, the first inorganic insulating film 16, the second inorganic insulating film 18, and the third inorganic insulating film 20, which are high in bending stiffness, is removed with a slit of the corresponding member. Hence, in the position to overlap the fold portion FD in the frame region NA, the layers above the resin layer 12 include only the fold-portion resin layer 19, the planarization film 21, and the source-wire-layer frame wire SC all of which are low in bending stiffness. Such a feature makes it possible to reduce stress on the layers of the display device 2 when the display device 2 is folded along the fold portion FD.

As shown in the illustration (a) of FIG. 10, the source-wire-layer frame wire SC overlaps the film layer 10 also when the fold-back region FL is folded back against the back face of the display device 2. That is, the film-layer second slit 10B does not overlap the connection wire CL in the fold-back region FL, either. Likewise, the inorganic-insulating-film second slit SB does not overlap the connection wire CL in the fold-back region FL, either.

Here, an illustration (b) of FIG. 10 shows the display device 2 in the illustration (a) of FIG. 10. The display device 2 is bent in a direction orthogonal to the folding direction of the fold portion FD such that a crease is formed on the display device 2 along the X-axis. As shown in the illustration (b) of FIG. 10, the display device 2 bends greater in a bend portion R, in which the film layer 10 and the inorganic insulating films are removed such that bending stiffness is relatively low, than in a stiff portion S, in which the film layer 10 and the inorganic insulating films are formed such that bending stiffness is relatively high.

Hence, the connection wire CL, positioned to overlap the stiff portion S bending little, is less likely to receive stress even if bending. Such a feature makes it possible to reduce the risk of breaking the connection wire CL due to the bend of the display device 2. Moreover, compared with a case where no bend portion R is provided, the display device 2 is more likely to bend in the direction orthogonal to the folding direction of the fold portion FD; that is, a direction in which a crease is formed on the display device 2 along the X-axis. Such a feature allows the fold portion FD to be bent in a direction different from the folding direction, while reducing the risk of breaking the connection line CL in the fold portion FD.

In this embodiment, the display device 2 includes, but not limited to, both the film-layer second slit 10B and the inorganic-insulating-film second slit SB. Alternatively, the display device 2 including either the film-layer second slit 10B or the inorganic-insulating-film second slit SB may also achieve advantageous effects described above. Note that, the display device 2 including both the film-layer second slit 10B and the inorganic-insulating-film second slit SB can further reduce the risk of breaking the connection wire CL and facilitate bending of the fold portion FD in a direction different from the folding direction.

Moreover, in this embodiment, each of the film-layer second slit 10B and the inorganic-insulating-film second slit SB is respectively branched from the film layer first slit 10A and the inorganic-insulating-film first slit SA, and is shaped substantially semicircularly. However, the shape of the film-layer second slit 10B and the inorganic-insulating-film second slit SB shall not be limited to the semicircle in particular, as long as the shape includes a curve in a portion where stress concentrates.

Furthermore, in the above description, the connection wire CL in the fold-back region FL is of two types including: the first gate-electrode-layer frame wire GE1 and the second gate-electrode-layer frame wire GE2; and the first capacitance-electrode-layer frame wire CE1 and the second capacitance-electrode-layer frame wire CE2. However, the connection wire CL shall not be limited to the two types. If the wires have a sufficient width and spacing between the neighboring wires, the connection wire CL may be of either one type. Moreover, in a case where more kinds of signals are to be applied to wires; that is, a case where wires receiving a function signal including a touch panel signal and a plurality of signals for video signal lines are to be routed in the same region, the wires may include two or more kinds of wires.

Although not shown in this embodiment, the end 19B, formed to lie out of the inorganic-insulating-film second slit SB, may be formed in a position to overlap the end 19A as long as the wire CL is free from break and is resistant to adverse environmental conditions.

Although not shown in this embodiment, a protective resin layer may further be formed on the planarization film 21 in the fold portion, to enhance the structure of the display device 2 against the external environment. The protective resin layer may be formed in any given stage; that is, either before or after the fold portion FD is folded.

Although not shown in this embodiment, a protective resin is further applied in a space created between the film layer 10 and the resin layer 12 after the fold portion FD is folded, to further enhance the structure of the display device 2 against the external environment.

Figure 11:
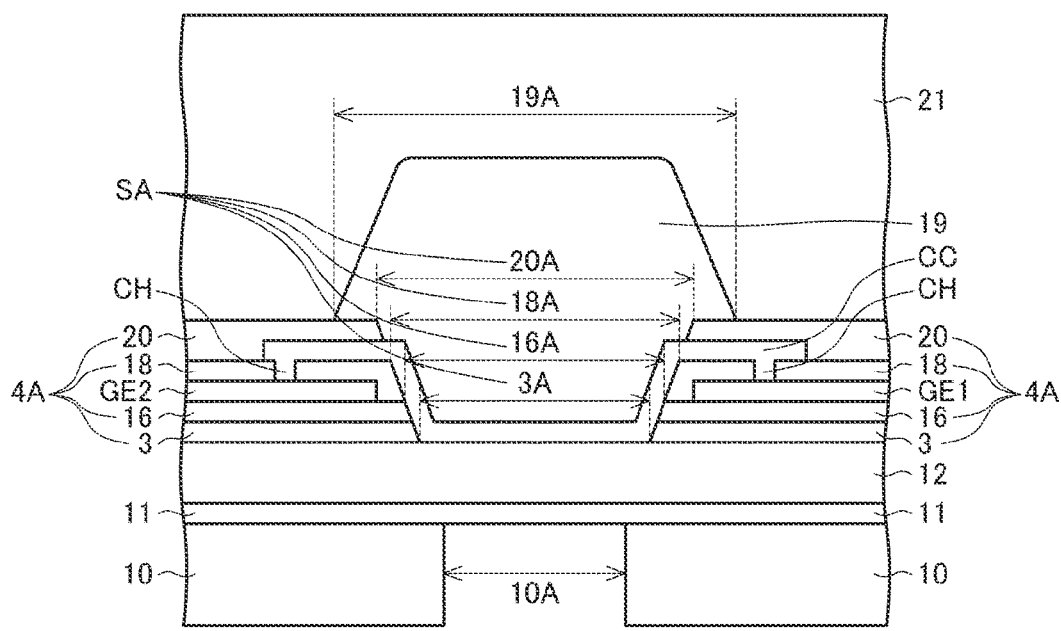
FIG. 11 illustrates a schematic cross-sectional view of a fold portion of the display device according to a modification of the disclosure.

Modification A structure of the display device 2 according to a modification of this embodiment is described with reference to FIG. 11. FIG. 11 is a cross-sectional view of the display device 2 according to this modification, corresponding to the illustration (a) of FIG. 4.

In this modification, the display device 2 includes a capacitance-electrode-layer frame wire CC provided in a position to overlap the inorganic-insulating-film first slit SA, and electrically connecting the first gate-electrode-layer frame wire GE1 and the second gate-electrode-layer frame wire GE2 together. The capacitance-electrode-layer frame wire CC is formed in the same layer, and of the same material, as the capacitance electrode CE is formed. Hence, the capacitance-electrode-layer frame wire CC electrically connects to the first gate-electrode-layer frame wire GE1 and to the second gate-electrode-layer frame wire GE2 through the contact CH in the contact hole formed in the second inorganic insulating film 18. Moreover, the capacitance-electrode-layer frame wire CC is formed below the fold-portion resin layer 19.

Note that, as shown in the illustration (b) of FIG. 4, the source-wire-layer frame wire SC in this modification is formed in a position where the first capacitance-electrode-layer frame wire CE1 and the second capacitance-electrode-layer frame wire CE2 are led out. Hence, in this modification, the capacitance-electrode-layer frame wire CC and the source-wire-layer frame wire SC are alternatively formed adjacently to each other in a position to overlap the inorganic-insulating-film first slit SA.

In this modification, the capacitance-electrode-layer frame wire CC and the source-wire-layer frame wire SC, each of which is a different frame wire, are formed in a position to overlap the inorganic-insulating-film first slit SA. Hence, the layers to be formed are different from each other, making it possible to further reduce short circuit of the neighboring frame wires.

Second Embodiment

Figure 12:
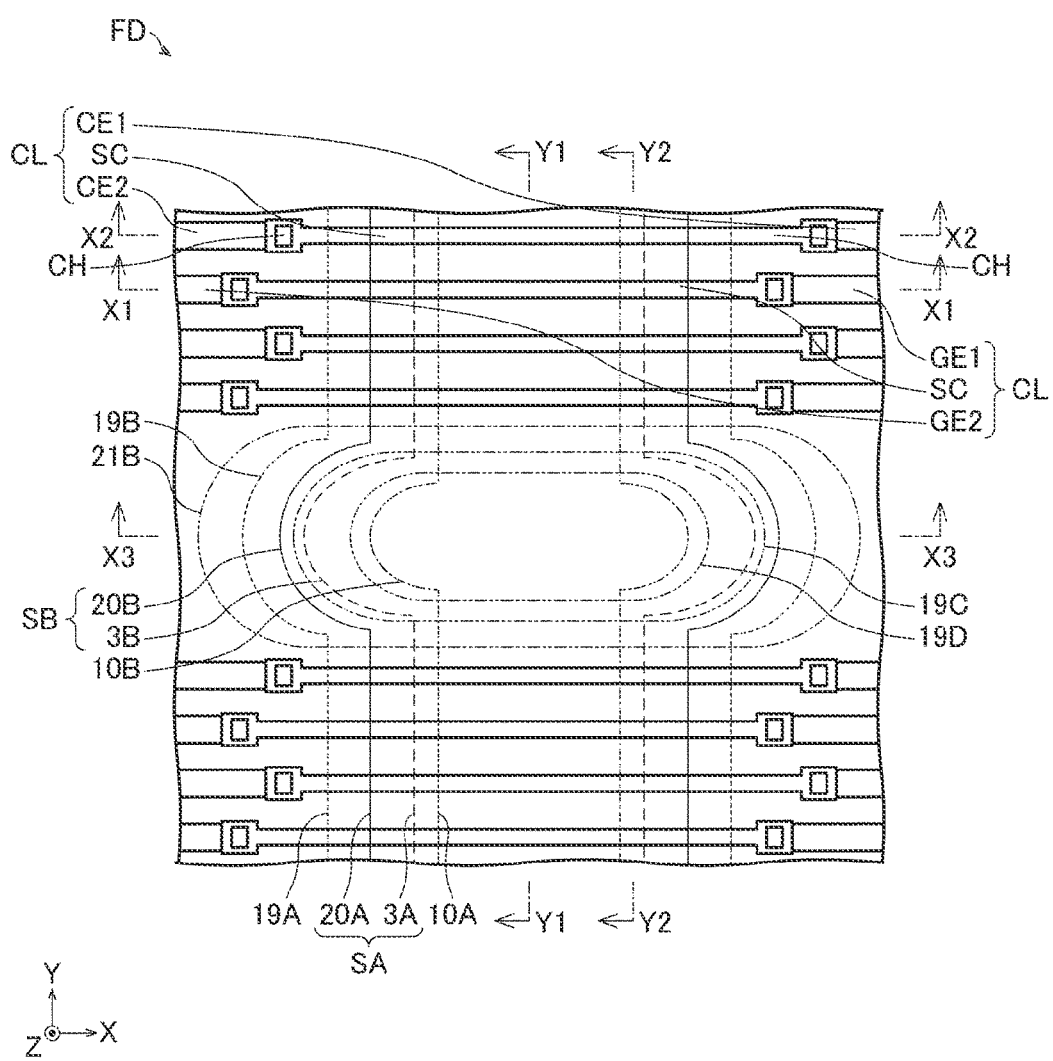
FIG. 12 illustrates an enlarged top view of a fold portion of the display device according to a second embodiment of the disclosure.

FIG. 12 illustrates an enlarged top view of the display device 2 according to this embodiment, corresponding to FIG. 3. Comparing the display device 2 according to this embodiment with the one according to the previous embodiment, the fold-portion resin layer 19 serving as the first resin film includes a fold-portion-resin-layer recess 19C serving as a first resin film recess. The fold-portion-resin-layer recess 19C includes a bottom 19D. Furthermore, comparing the display device 2 according to this embodiment with the one according to the previous embodiment, the planarization film 21 serving as the second resin film includes a planarization-film slit 21B formed in the frame region NA and serving as a second-resin-film slit. Other than those points, the display device 2 according to this embodiment has the same features as the display device 2 according to the previous embodiment has.

Figure 13:
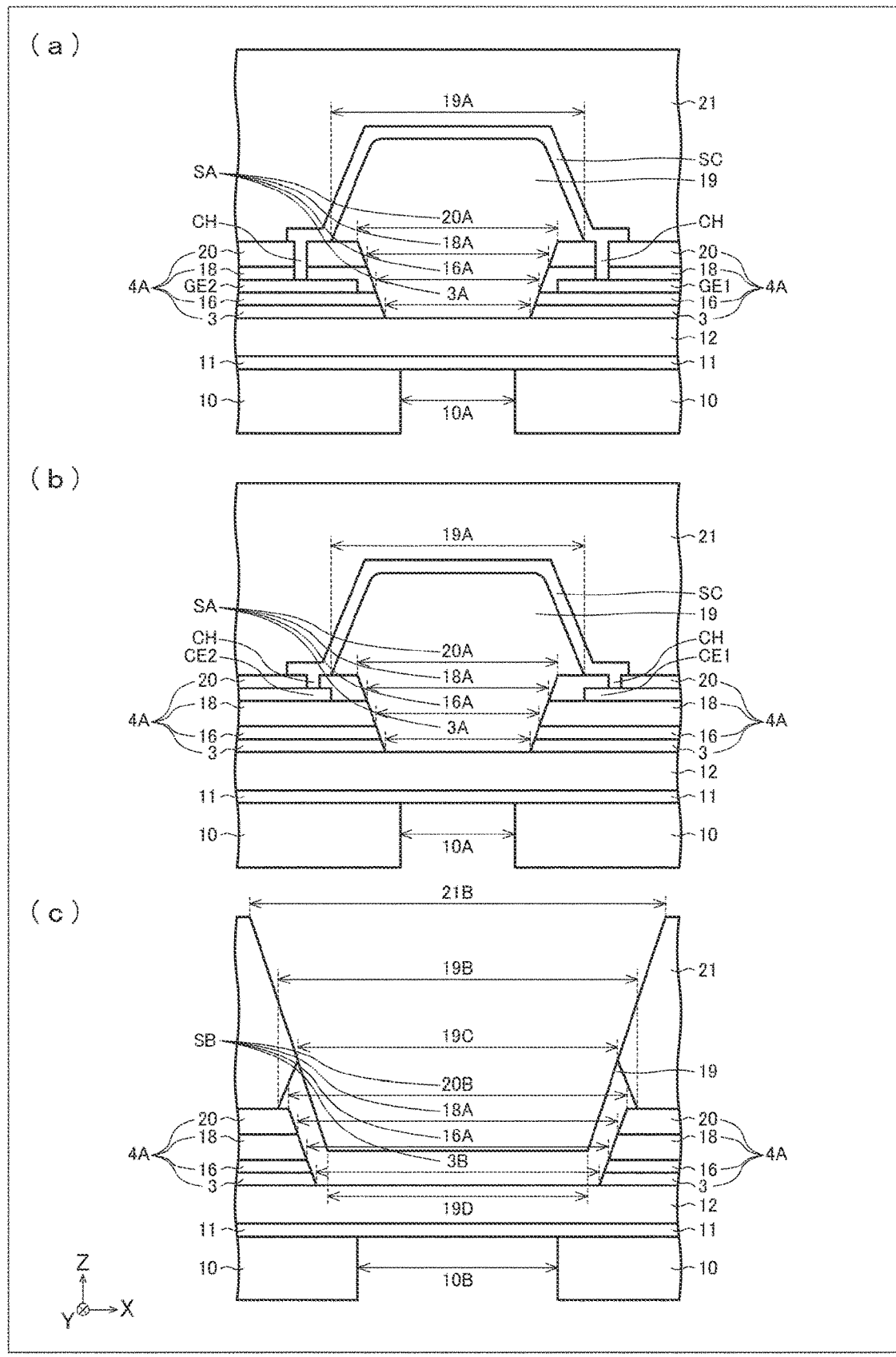
FIG. 13 illustrates a schematic cross-sectional view of the fold portion of the display device according to the second embodiment of the disclosure.
Figure 14:
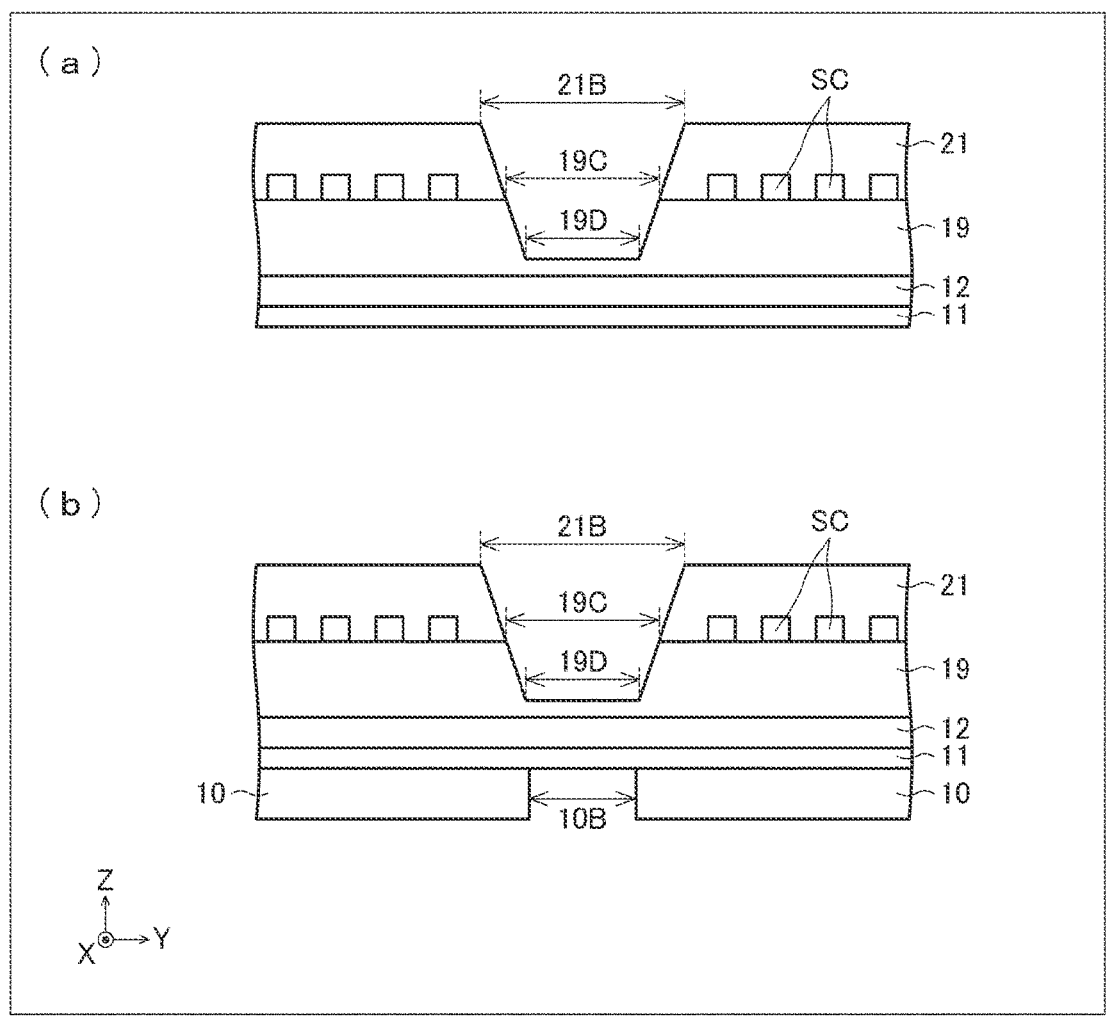
FIG. 14 illustrates an other schematic cross-sectional view of the fold portion of the display device according to the second embodiment of the disclosure.

The fold-portion-resin-layer recess 19C and the planarization-film slit 21B according to this embodiment are described in detail, with reference to FIGS. 13 and 14. An illustration (a) of FIG. 13 is a cross-sectional view taken along arrows X1-X1 in FIG. 12. An illustration (b) of FIG. 13 is a cross-sectional view taken along arrows X2-X2 in FIG. 12. An illustration (c) of FIG. 13 is a cross-sectional view taken along arrows X3-X3 in FIG. 12. An illustration (a) of FIG. 14 is a cross-sectional view taken along arrows Y1-Y1 in FIG. 12. An illustration (b) of FIG. 14 is a cross-sectional view taken along arrows Y2-Y2 in FIG. 12.

As shown in the illustrations (a) and (b) of FIG. 13, the display device 2 does not include either the fold-portion-resin-layer recess 19C or the planarization-film slit 21B in a position to overlap the connection wire CL. Hence, in a position where the connection wire CL is formed, the display device 2 according to this embodiment has the same in layer structure as the display device 2 according to the previous embodiment has.

Meanwhile, as shown in FIG. 12 and the illustration (c) of FIG. 13, the display device 2 includes the planarization-film slit 21B in a position to overlap the third-inorganic-insulating-film second slit 20B, the barrier-layer second slit 3B, and the film-layer second slit 10B. Moreover, as shown in FIG. 12 and the illustration (c) of FIG. 13, the display device 2 includes the fold-portion-resin-layer recess 19C in a position to overlap the planarization film slit 21B. Furthermore, as shown in the illustrations (a) and (b) of FIG. 14, the fold-portion-resin-layer recess 19C and the planarization-film slit 21B are formed between pluralities of the connection wires CL adjacent to each other, and do not overlap the connection wires CL.

Figure 15:
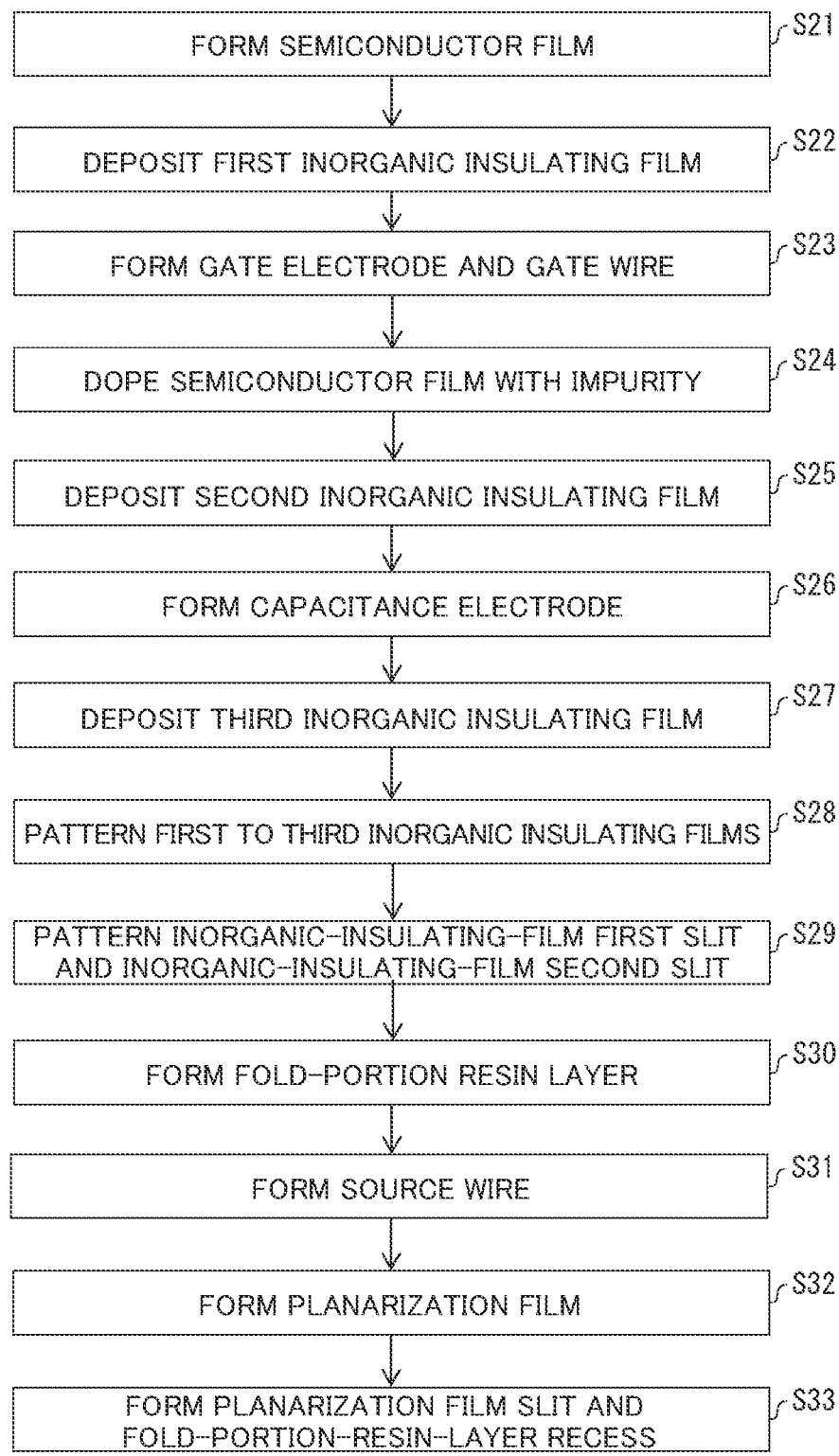
FIG. 15 illustrates a flowchart showing an example of a method for manufacturing a TFT layer of the display device according to the second embodiment of the disclosure.

A method for manufacturing the display device 2 according to this embodiment is described, with reference to a flowchart in FIG. 15. The method for manufacturing the display device 2 according to this embodiment is the same as that according to the previous embodiment up to Step S32, and the descriptions thereof shall be omitted. In this embodiment, at Step S33 following Step S32, the planarization film slit 21B and the fold-portion-resin-layer recess 19C are formed. At Step S33, the planarization film 21 and the fold-portion resin layer 19 are patterned by, for example, photolithography. In forming the fold-portion-resin-layer recess 19C, the bottom 19D is formed to have a thickness from the resin layer 12.

Figure 16:
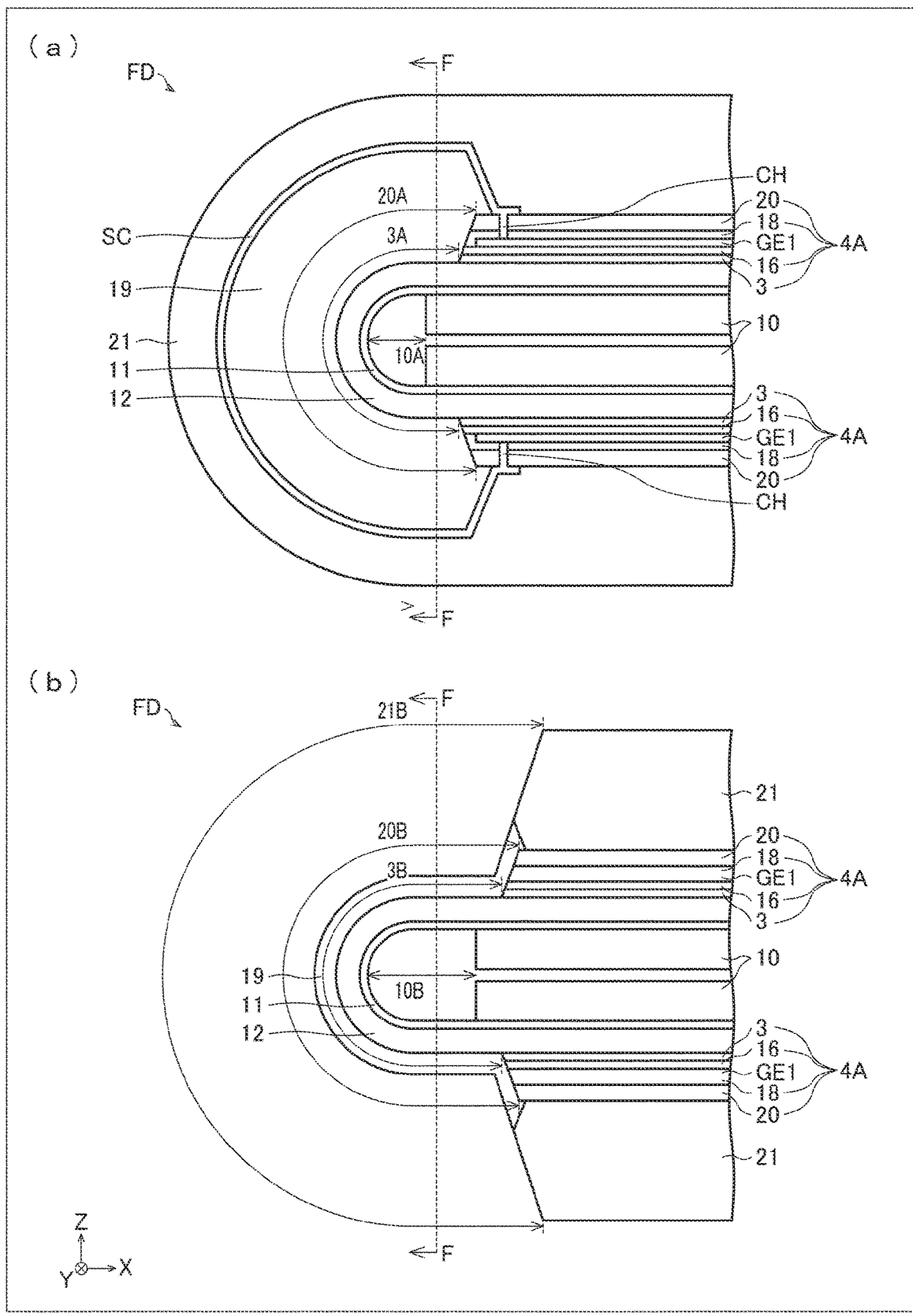
FIG. 16 illustrates a schematic cross-sectional view of the folded fold portion of the display device according to the second embodiment of the disclosure.
Figure 17:
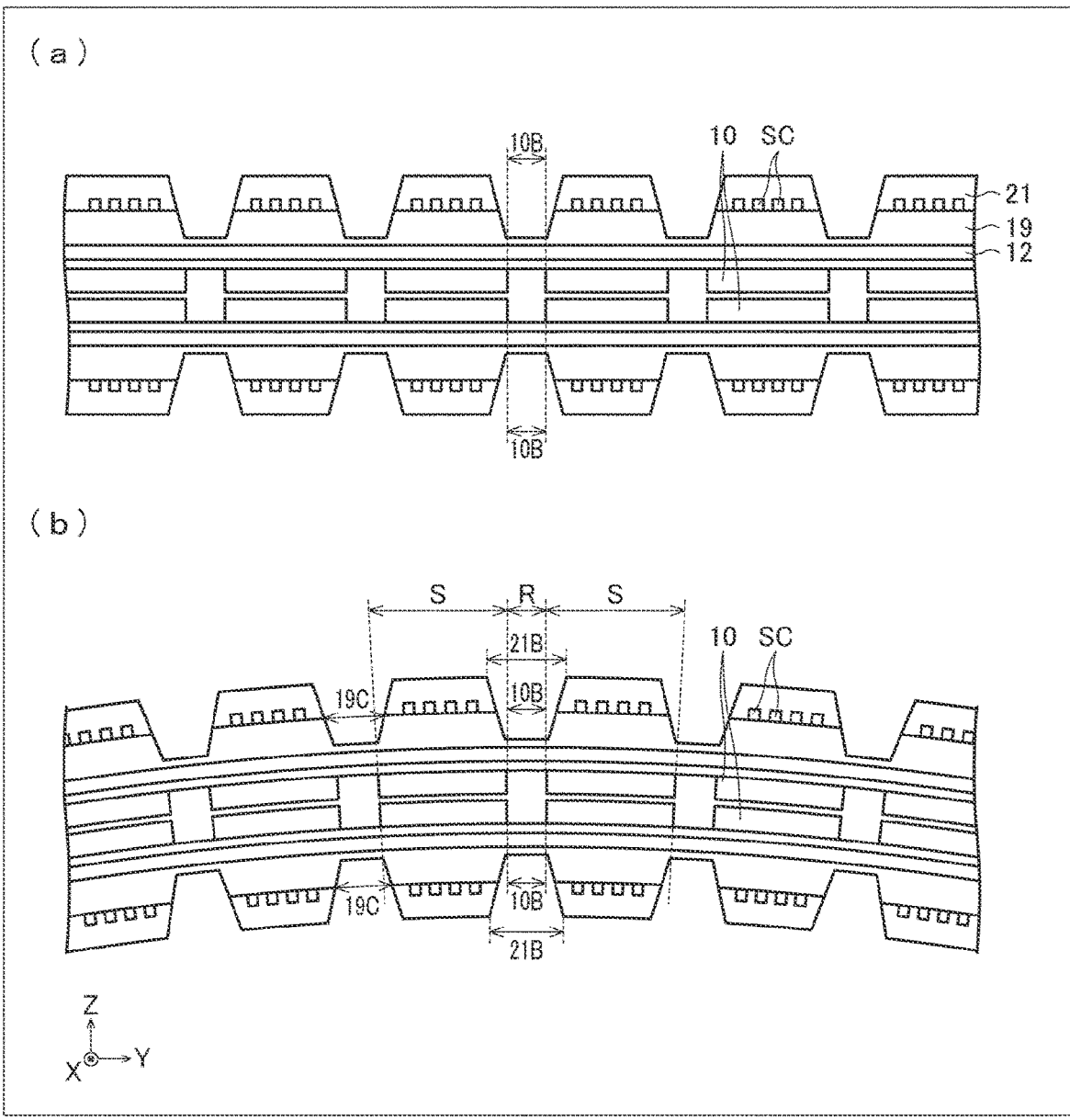
FIG. 17 illustrates an other schematic cross-sectional view of the folded fold portion of the display device according to the second embodiment of the disclosure.

The display device 2 according to this embodiment is also folded at an end, of the fold portion FD, toward the display region DA, so that a portion, of the frame region NA, including the terminal T can be folded back against the back face of the display device 2. Described below in detail with reference to FIGS. 16 and 17 is a structure around the fold portion FD when a portion, of the frame region NA, including the terminal T is folded back against the back face of the display device 2. Note that an illustration (a) of FIG. 16, an illustration (b) of FIG. 16, and an illustration (a) of FIG. 17 are cross-sectional views respectively corresponding to the illustration (a) of FIG. 9, the illustration (b) of FIG. 9, and the illustration (a) of FIG. 10.

In this embodiment, as shown in the illustrations (a) and (b) of FIG. 16, the film layer 10 in the position to overlap the fold portion FD is removed with the film-layer first slit 10A or the film-layer second slit 10B. Hence, even if the display device 2 is folded along the fold portion FD, the film layer 10 is free from great stress.

Moreover, as shown in the illustration (b) of FIG. 16, only the bonding layer 11, the resin layer 12, and the fold-portion resin layer 19 of the fold portion FD overlap one another in a position where the fold-portion-resin-layer recess 19C and the planarization film slit 21B are formed. Hence, the display device 2 according to this embodiment can be bent more readily along the fold portion FD.

As shown in an illustration (a) of FIG. 17 in this embodiment, neither the film-layer second slit 10B nor the inorganic-insulating-film second slit SB overlaps the connection wire CL in the fold-back region FL. In addition, as shown in the illustration (a) of FIG. 17, neither the fold-portion-resin-layer recess 19C nor the planarization-film slit 21B overlaps the connection wire CL in the fold-back region FL.

Here, an illustration (b) of FIG. 17 shows the display device 2 in the illustration (a) of FIG. 17. The display device 2 is bent in a direction orthogonal to the folding direction of the fold portion FD. Here, the illustration (b) of FIG. 17 shows that, in the bend portion R of the display device 2, not only the film layer 10 and the inorganic insulating films but also a portion of the fold-portion resin layer 19 and the planarization film 21 are also removed. Compared with the previous embodiment, the bend portion R is further lower in bending stiffness than the stiff portion S, so that the display device 2 is likely to bend further at the bend portion R.

Hence, the stiff portion S is less likely to bend, and that is why the risk of breaking the connection wire CL, formed in a position to overlap the stiff portion S, is further reduced when the display device 2 is bent. In addition, the lower bending stiffness of the bend portion R allows the display device 2 to be bent more readily in a direction different from the folding direction of the fold portion FD.

In this embodiment, the planarization film 21, formed in a position where the film layer 10 and the connection line CL do not overlap, is entirely removed along the thickness of the display device 2. Hence, the planarization-film slit 21B is formed. Moreover, in this embodiment, a portion of the fold-portion resin layer 19, formed in a position where the film layer 10 and the connection line CL do not overlap, is removed along the thickness of the display device 2. Hence, the fold-portion-resin-layer recess 19C is formed. However, the slit and the recess may be formed in any given manner. In this embodiment, removed may be only a portion of the planarization film 21 in a position where the film layer 10 and the connection wire CL do not overlap. Hence, a recess may be formed on the planarization film instead of the fold-portion-resin-layer recess 19C and the planarization-film slit 21B. In this case, too, the display device 2 can be bent more readily in a direction different from the folding direction of the fold portion FD.

Third Embodiment

Figure 18:
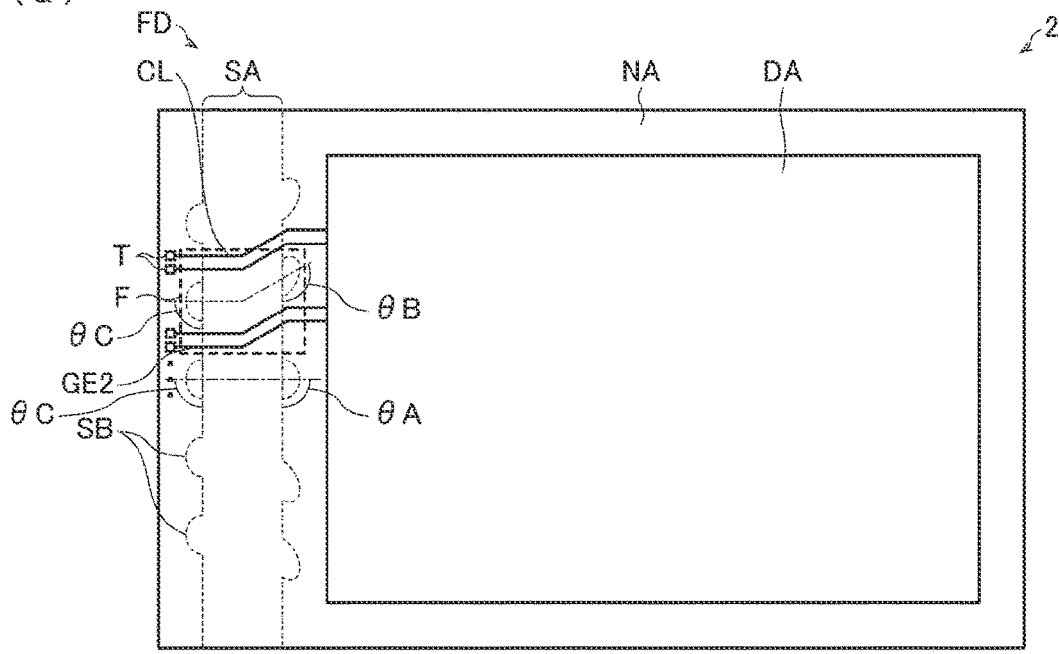
FIG. 18 illustrates a schematic top view and a schematic back view of the display device according to a third embodiment of the disclosure.
Figure 18:
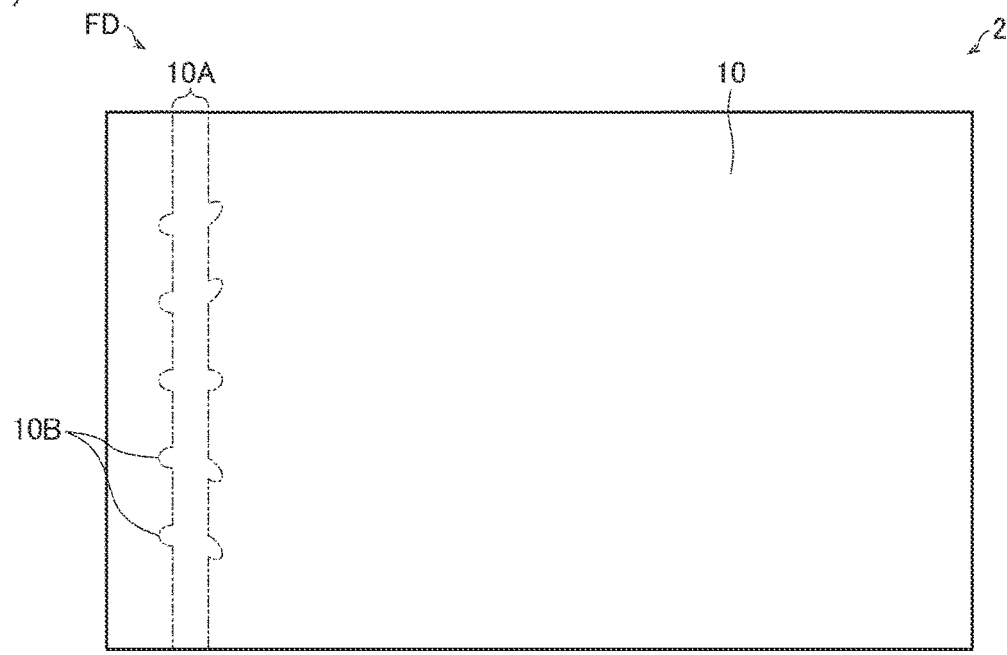
Figure 19:
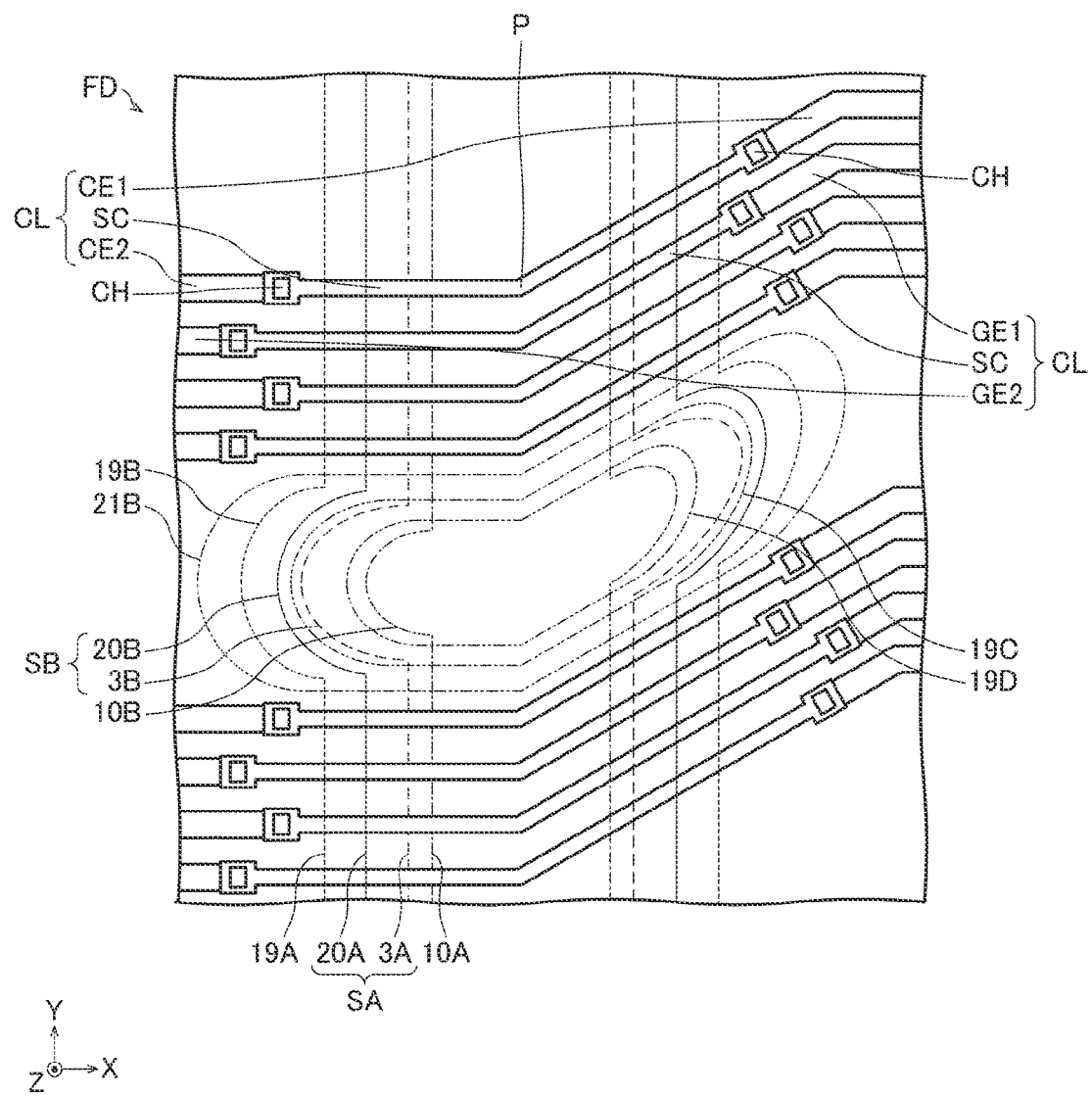
FIG. 19 illustrates an enlarged top view of a fold portion of the display device according to a third embodiment of the disclosure.

An illustration (a) of FIG. 18 is a top view of the display device 2 according to this embodiment. An illustration (b) of FIG. 18 is a back view of the display device 2 according to this embodiment. FIG. 19 is an enlarged top view of a region F in the illustration (a) of FIG. 18; that is, a view around the third-inorganic-insulating-film second slit 20B. Note that, as seen in FIG. 1, FIG. 18 also illustrates the display device 2 on a substantial plane and not folded along the fold portion FD.

As shown in FIGS. 18 and 19, in the display device 2 according to this embodiment, at least one inorganic-insulating-film second slit SB obliquely intersects with an end, of the inorganic-insulating-film first slit SA, toward the display region DA. Moreover, in the display device 2 according to this embodiment, at least one film-layer second slit 10B obliquely intersects with an end, of the film-layer first slit 10A, toward the display region DA. In addition, at least one inorganic-insulating-film second slit SB and at least one film-layer second slit 10B overlap.

Furthermore, in the display device 2 according to this embodiment, the connection wire CL obliquely intersects with the end, of the inorganic-insulating-film first slit SA, toward the display region DA to run along the inorganic-insulating-film second slit SB. Likewise, in the display device 2 according to this embodiment, the connection wire CL obliquely intersects with the end, of the film-layer first slit 10A, toward the display region DA, to run along the film-layer second slit 10B.

Meanwhile, the connection wire CL extends from the terminal T and orthogonally intersects with ends, of the inorganic-insulating-film first slit SA and the film-layer first slit 10A, toward the terminal T. Because the connection wire CL obliquely intersects with the ends, of the inorganic-insulating-film first slit SA and the film-layer first slit 10A, toward the display region DA, the connection wire CL includes a bend point P at which the connection wire CL obliquely bends above the inorganic-insulating-film first slit SA and the film-layer first slit 10A.

Here, as illustrated in FIG. 19 of this embodiment, the fold-portion-resin-layer recess 19C and the planarization-film slit 21B are formed to run along the inorganic-insulating-film second slit SB and the film-layer second slit 10B. That is, the fold-portion-resin-layer recess 19C and the planarization-film slit 21B obliquely intersect with the ends, of the inorganic-insulating-film first slit SA and the film-layer first slit 10A, toward the display region DA.

Other than those points, the display device 2 according to this embodiment has the same features as the display device 2 according to the previous embodiments has. Moreover, the display device 2 according to this embodiment may be manufactured by the same method for manufacturing the display device 2 according to the previous embodiments.

In the display device 2 according to this embodiment, at least one inorganic-insulating-film second slit SB and at least one film-layer second slit 10B obliquely intersect with the ends, of the inorganic-insulating-film first slit SA and the film-layer first slit 10A, toward the display region DA. Such a feature makes it possible to decrease a distance from the display region DA to the ends of the inorganic-insulating-film first slit SA and the film-layer first slit 10A. As a result, the area of the frame region NA can be reduced.

In this embodiment, as illustrated in FIG. 18, the inorganic-insulating-film second slits SB include an inorganic-insulating-film second slit SB positioned in a center of the fold portion FD, and orthogonally intersecting with opposing ends of the inorganic-insulating-film first slit SA. Meanwhile, the inorganic-insulating-film second slits SB include an inorganic-insulating-film second slit SB positioned closer to an end than to the center of the fold portion FD, and obliquely intersecting with an end, of the inorganic-insulating-film first slit SA, toward the display region DA.

Any inorganic-insulating-film second slit SB obliquely intersecting with an end of the inorganic-insulating-film first slit SA is angled at the display region DA to run from the center toward an end of the fold portion FD.

Here, to the display region DA of the fold portion FD, an angle θ is formed at an intersection of a center axis of an inorganic-insulating-film second slit SB with a line in parallel with the Y-axis. In such a case, as shown in the illustration (a) of FIG. 18, the angle θ is a right angle θA if the inorganic-insulating-film second slit SB is in the center of the fold portion FD. Moreover, as shown in the illustration (a) of FIG. 18, the angle θ is an obtuse angle θB if the inorganic-insulating-film second slit SB is formed in the positive direction along the Y-axis in relation to the center of the fold portion FD.

Next, to the terminal T of the fold portion FD, an angle θ is formed at the intersection of the center axis of an inorganic-insulating-film second slit SB with the line in parallel with the Y-axis. In such a case, as shown in the illustration (a) of FIG. 18, the angle θ is a right angle θC regardless of the position of the inorganic-insulating-film second slit SB. That is, in this embodiment, all the inorganic-insulating-film second slits SB intersect, at a right angle, with the ends, of the inorganic-insulating-film first slit SA, toward the terminal T.

As shown in the illustration (a) of FIG. 18, the inorganic-insulating-film second slits SB are provided to shorten the length of the connection wires CL, as well as to decrease the distance between the terminals T, contributing to reduce the size of the mounting area. Note that, as shown in the illustration (b) of FIG. 18, a film-layer second slit 10B, positioned closer to an end than to the center of the fold portion FD, may also be obliquely intersect with an end, of the film-layer first slit 10A, toward the display region DA.

In this embodiment, the bend point P at which the connection wire CL bends is disposed to overlap the inorganic-insulating-film first slit SA and the film-layer first slit 10A at a subsequent center of the film-layer first slit 10A.

However, the position of the bend point P shall not be limited to such a position. Each of the bend points P may be shifted in a different position toward the terminals T or toward the display region DA, as long as the bend points P overlap the inorganic-insulating-film first slit SA. Furthermore, the inorganic-insulating-film second slit SB, the film-layer second slit 10B, the fold-portion-resin-layer recess 19C, and the planarization-film slit 21B may also shift toward the terminals T or toward the display region DA in accordance with the shift of the bend point P.

Moreover, in this embodiment, the connection wire CL led out from a terminal T extends orthogonally to the film-layer first slit 10A and intersects obliquely with the connection wire CL led out from the display region DA. However, the connection line CL may be formed in any given direction. The connection line CL led out from the terminal T may extend in a different oblique direction, in relation to the film-layer first slit 10A, from the oblique direction of the connection line CL led out from the display region DA. In this case, too, the inorganic-insulating-film second slit SB, the film-layer second slit 10B, the fold-portion-resin-layer recess 19C, and the planarization-film slit 21B may be shaped conformably to the connection wire CL led out from the display region DA.

The display device 2 in the above embodiments may include a flexible display panel including a bendable display element. The display element includes two kinds of display elements: one of which has brightness and transmittance controlled by current, and an other one of which by voltage.

The display device 2 according to the above embodiments may include, for example, an OLED as a display element controlled by current. In this case, the display device according to this embodiment may be an organic electroluminescence (EL) display.

The display device 2 according to the above embodiments may include an inorganic light-emitting diode as a display element controlled by current. In such a case, the display device according to this embodiment may include an EL display such as an inorganic EL display, and a quantum dot light-emitting diode (QLED) display including a QLED.

Moreover, the display elements controlled by voltage include liquid crystal display elements.

SUMMARY

A display device according to a first aspect includes: a display region including a plurality of display elements, and a frame region surrounding the display region; a film layer and a TFT layer stacked on top of an other in a stated order, the TFT layer including at least one inorganic insulating film; and a terminal and a fold portion in the frame region, the fold portion being formed between the terminal and the display region. The display device includes: an inorganic-insulating-film first slit provided to the inorganic insulating film, and a film-layer first slit provided to the film layer, the inorganic-insulating-film first slit and the film-layer first slit overlapping at least the fold portion, and extending in a direction to intersect with an edge of the frame region; a first resin film included in the TFT layer and provided to fill the inorganic-insulating-film first slit; a plurality of connection wires provided above the inorganic insulating film and the first resin film to overlap, and to intersect with, the fold portion, the connection wires electrically connecting the terminal to a wire in the display region; and either an inorganic-insulating-film second slit overlapping the fold portion and intersecting with the inorganic-insulating-film first slit, or a film-layer second slit overlapping the fold portion and intersecting with the film-layer first slit, either the inorganic-insulating-film second slit or the film-layer second slit being provided between pluralities of the connection wires adjacent to each other.

In a second aspect, the inorganic-insulating-film second slit may be wider than the film-layer second slit.

In a third aspect, the first resin film may be provided to further fill the inorganic-insulating-film second slit.

In a fourth aspect, the first resin film may include a first resin film recess to overlap either the inorganic-insulating-film second slit or the film-layer second slit.

In a fifth aspect, the display device may further include a second resin film formed on the first resin film and the connection wires, wherein the second resin film may include either a second resin film slit or a second resin film recess to overlap either the inorganic-insulating-film second slit or the film-layer second slit.

In a sixth aspect, (i) the inorganic-insulating-film second slit may lie closer to the display region and the terminal than the inorganic-insulating-film first slit lies, or (ii) the film-layer second slit may lie closer to the display region and the terminal than the film-layer first slit lies.

In a seventh aspect, (i) at least one of a plurality of the inorganic-insulating-film second slits may obliquely intersect with an end, of the inorganic-insulating-film first slit, toward the display region, or (ii) at least one of a plurality of the film-layer second slits may obliquely intersect with an end, of the film-layer first slit, toward the display region.

In an eighth aspect, the connection wires may obliquely intersect with either: at least the end, of the inorganic-insulating-film first slit, toward the display region to run along the inorganic-insulating-film second slit; or at least the end, of the film-layer first slit, toward the display region to run along the film-layer second slit.

In a ninth aspect, a plurality of the inorganic-insulating-film second slits may include: an inorganic-insulating-film second slit positioned in a center of the fold portion, and orthogonally intersecting with opposing ends of the inorganic-insulating-film first slit; and an inorganic-insulating-film second slit positioned closer to an end than to a center of the fold portion, and obliquely intersecting with an end of the inorganic-insulating-film first slit.

In a tenth aspect, the connection wires may extend from the terminal and orthogonally intersect with an end, of either the inorganic-insulating-film first slit or the film-layer first slit, toward the terminal, and each of the connection wires may include a bend point at which the connection wire obliquely bends above either the inorganic-insulating-film first slit or the film-layer first slit.

In an eleventh aspect, the first resin film may include a first resin film recess formed: to run along either the inorganic-insulating-film second slit obliquely intersecting with an end of the inorganic-insulating-film first slit, or the film-layer second slit obliquely intersecting with an end of the film-layer first slit; and to overlap either the inorganic-insulating-film second slit, or the film-layer second slit.

In a twelfth aspect, the display device may further include a second resin film formed on the first resin film and the connection wires, wherein the second resin film may include either a second resin film slit or a second resin film recess formed: to run along either the inorganic-insulating-film second slit obliquely intersecting with an end of the inorganic-insulating-film first slit, or the film-layer second slit obliquely intersecting with an end of the film-layer first slit; and to overlap either the inorganic-insulating-film second slit, or the film-layer second slit.

In a thirteenth aspect, the display device may include both the inorganic-insulating-film second slit and the film-layer second slit.

In a fourteenth aspect, the inorganic-insulating-film second slit may be wider than the film-layer second slit.

A fifteenth aspect is directed to a method for manufacturing a display device. The display device includes: a display region including a plurality of display elements, and a frame region surrounding the display region; a film layer and a TFT layer stacked on top of an other in a stated order, the TFT layer including at least one inorganic insulating film; and a terminal and a fold portion in the frame region, the fold portion being formed between the terminal and the display region. The method includes forming the film layer, and forming the TFT layer. The forming of the TFT layer includes forming an inorganic-insulating-film first slit in the fold portion, and the forming of the film layer includes a film-layer first slit in the fold portion. The inorganic-insulating-film first slit is provided to the inorganic insulating film. The film-layer first slit is provided to the film layer. The inorganic-insulating-film first slit and the film-layer first slit extend in a direction to intersect with an edge of the frame region. The forming of the TFT layer further includes: forming a first resin film provided to fill the inorganic-insulating-film first slit; and forming a plurality of connection wires provided above the inorganic insulating film and the first resin film to overlap, and to intersect with, the fold portion, the connection wires electrically connecting the terminal to a wire in the display region. The forming of the TFT layer involves forming an inorganic-insulating-film second slit intersecting with the inorganic-insulating-film first slit in the fold portion, and the forming of the film layer involves forming a film-layer second slit intersecting with the film-layer first slit in the fold portion. Either the inorganic-insulating-film second slit or the film-layer second slit is provided between pluralities of the connection wires adjacent to each other.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A display device including a display region, a frame region, a film layer, a TFT layer, a terminal, and a fold portion, the display region including a plurality of display elements, the frame region surrounding the display region, the TFT layer stacked on top of the film layer in a stated order, the TFT layer including at least one inorganic insulating film, the terminal and the fold portion in the frame region, the fold portion being formed between the terminal and the display region, the display device comprising:

an inorganic-insulating-film first slit provided to the at least one inorganic insulating film and a film-layer first slit provided to the film layer, the inorganic-insulating-film first slit and the film-layer first slit overlapping at least the fold portion and extending in a direction to intersect with an edge of the frame region;

a first resin film included in the TFT layer and provided to Fill the inorganic-insulating-film first slit;

a plurality of connection wires provided above the at least one inorganic insulating film and the first resin film to overlap, and to intersect with, the fold portion, the connection wires electrically connecting the terminal to a wire in the display region; and either an inorganic-insulating-film second slit overlapping the fold portion and intersecting with the inorganic-insulating-film first slit, or a film-layer second slit overlapping the fold portion and intersecting with the film-layer first slit, and either the inorganic-insulating-film second slit, or the film-layer second slit provided between pluralities of the connection wires adjacent to each other.

2. The display device according to claim 1, wherein
the inorganic-insulating-film first slit is wider than the film-layer first slit.

3. The display device according to claim 1, wherein
the first resin film is provided to further fill the inorganic-insulating-film second slit.

4. The display device according to claim 1, wherein
the first resin film includes a first resin film recess to overlap either the inorganic-insulating-film second slit or the film-layer second slit.

5. The display device according to claim 1, further comprising
a second resin film formed on the first resin film and the connection wires, wherein
the second resin film includes either a second resin film slit or a second resin film recess to overlap either the inorganic-insulating-film second slit or the film-layer second slit.

6. The display device according to claim 1, wherein
the inorganic-insulating-film second slit lies closer than the inorganic-insulating-film first slit lies to the display region and the terminal, or the film-layer second slit lies closer than the film-layer first slit lies to the display region and the terminal.

7. The display device according to claim 1, wherein
at least one of a plurality of the inorganic-insulating-film second slits obliquely intersects with an end of the inorganic-insulating-film first slit toward the display region, or at least one of a plurality of the film-layer second slits obliquely intersects with an end of the film-layer first slit toward the display region.

8. The display device according to claim 7, wherein
the connection wires obliquely intersect with either at least the end of the inorganic-insulating-film first slit toward the display region to run along the inorganic-insulating-film second slit, or at least the end of the film-layer first slit toward the display region to run along the film-layer second slit.

9. The display device according to claim 8, wherein
the plurality of the inorganic-insulating-film second slits includes: an inorganic-insulating-film second slit positioned in a center of the fold portion and orthogonally intersecting with an end of the inorganic-insulating-film first slit toward the display region; and another inorganic-insulating-film second slit positioned closer than a center of the fold portion to an end of opposing ends of the inorganic-insulating-film first slit toward a longitudinal direction of the inorganic-insulating-film first slit and obliquely intersecting with the end of the inorganic-insulating-film first slit toward the display region.

10. The display device according to claim 7, wherein
the connection wires extend from the terminal and orthogonally intersect with an end of either the inorganic-insulating-film first slit or the film-layer first slit, toward the terminal, and each of the connection wires includes a bend point at which the connection wire obliquely bends above either the inorganic-insulating-film first slit or the film-layer first slit.

11. The display device according to claim 7, wherein the first resin film includes a first resin film recess formed to: run along either the inorganic-insulating-film second slit obliquely intersecting with the end of the inorganic-insulating-film first slit toward the display region, or the film-layer second slit obliquely intersecting with the end of the film-layer first slit toward the display region; and overlap either the inorganic-insulating-film second slit, or the film-layer second slit.

12. The display device according to claim 7, further comprising
a second resin film formed on the first resin film and the connection wires, wherein
the second resin film includes either a second resin film slit or a second resin film recess formed to: run along either the inorganic-insulating-film second slit obliquely intersecting with the end of the inorganic-insulating-film first slit toward the display region, or the film-layer second slit obliquely intersecting with the end of the film-layer first slit toward the display region; and overlap either the inorganic-insulating-film second slit, or the film-layer second slit.

13. The display device according to claim 1, comprising both the inorganic-insulating-film second slit and the film-layer second slit.

14. The display device according to claim 13, wherein the inorganic-insulating-film second slit is wider than the film-layer second slit.

15. A method for manufacturing a display device, the display device including:
a display region including a plurality of display elements;
a frame region surrounding the display region;
a film layer and a TFT layer stacked on top of the film layer in a stated order, the TFT layer including at least one inorganic insulating film; and
a terminal and a fold portion in the frame region, the fold portion formed between the terminal and the display region, the method comprising:
forming the film layer; and
forming the TFT layer,
the forming of the TFT layer including forming an inorganic-insulating-film first slit in the fold portion, and the forming of the film layer including a film-layer first slit in the fold portion, the inorganic-insulating-film first slit provided to the at least one inorganic insulating film, the film-layer first slit provided to the film layer, and the inorganic-insulating-film first slit and the film-layer first slit extending in a direction to intersect with an edge of the frame region,
the forming of the TFT layer further including:
forming a first resin film provided to fill the inorganic-insulating-film first slit; and
forming a plurality of connection wires provided above the at least one inorganic insulating film and the first resin film to overlap and to intersect the fold portion, the connection wires electrically connecting the terminal to a wire in the display region, and
the forming of the TFT layer including forming an inorganic-insulating-film second slit intersecting with the inorganic-insulating-film first slit in the fold portion, and the forming of the film layer including forming a film-layer second slit intersecting with the film-layer first slit in the fold portion, and either the inorganic-insulating-film second slit or the film-layer second slit provided between adjacent groups of the pluralities of the connection wires.

* * * * *